US011095096B2

(12) United States Patent
Han et al.

(10) Patent No.: US 11,095,096 B2
(45) Date of Patent: Aug. 17, 2021

(54) METHOD FOR A GAN VERTICAL MICROCAVITY SURFACE EMITTING LASER (VCSEL)

(71) Applicant: Yale University, New Haven, CT (US)

(72) Inventors: Jung Han, Woodbridge, CT (US); Chia-Feng Lin, New Haven, CT (US); Danti Chen, New Haven, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 14/687,814

(22) Filed: Apr. 15, 2015

(65) Prior Publication Data
US 2015/0303655 A1 Oct. 22, 2015

Related U.S. Application Data

(60) Provisional application No. 61/980,313, filed on Apr. 16, 2014.

(51) Int. Cl.
H01S 5/183 (2006.01)
H01S 5/343 (2006.01)
H01L 21/02 (2006.01)
H01S 5/042 (2006.01)

(52) U.S. Cl.
CPC .... *H01S 5/34333* (2013.01); *H01L 21/02203* (2013.01); *H01S 5/04253* (2019.08); *H01S 5/18311* (2013.01); *H01S 5/18363* (2013.01); *H01S 5/04257* (2019.08); *H01S 5/18341* (2013.01)

(58) Field of Classification Search
CPC .......................... H01S 5/18311; H01S 5/18363
See application file for complete search history.

(56) References Cited

U.S. PATENT DOCUMENTS 5,262,021 A 11/1993 Volker et al.
5,307,361 A 4/1994 Kahen et al.
5,502,787 A 3/1996 Capasso et al.
(Continued)

FOREIGN PATENT DOCUMENTS

CN 101443887 A 5/2009
CN 102782818 A 11/2012
(Continued)

OTHER PUBLICATIONS

Todt et al. ("Oxidation kinetics and microstructure of wet-oxidized MBE-grown short-period AlGaAs superlattices", Mat. Res. Soc. Symp. Proc, vol. 692, 2002).*
(Continued)

*Primary Examiner* — Tod T Van Roy
(74) *Attorney, Agent, or Firm* — Wolf, Greenfield & Sacks, P.C.

(57) ABSTRACT

Methods and structures for forming vertical-cavity light-emitting devices are described. An n-side or bottom-side layer may be laterally etched to form a porous semiconductor region and converted to a porous oxide. The porous oxide can provide a current-blocking and guiding layer that aids in directing bias current through an active area of the light-emitting device. Distributed Bragg reflectors may be fabricated on both sides of the active region to form a vertical-cavity surface-emitting laser. The light-emitting devices may be formed from III-nitride materials.

30 Claims, 13 Drawing Sheets

(56) References Cited

U.S. PATENT DOCUMENTS

| | | | |
|---|---|---|---|
| 5,509,026 A | 4/1996 | Sasaki et al. | |
| 5,644,156 A | 7/1997 | Suzuki et al. | |
| 5,818,861 A | 10/1998 | Tan et al. | |
| 5,919,430 A | 7/1999 | Hasenzahl et al. | |
| 6,233,267 B1 | 5/2001 | Nurmikko et al. | |
| 6,306,672 B1 | 10/2001 | Kim | |
| 6,320,206 B1 | 11/2001 | Coman et al. | |
| 6,537,838 B2 | 3/2003 | Stockman | |
| 6,597,017 B1 | 7/2003 | Seko et al. | |
| 6,597,490 B2 | 7/2003 | Tayebati | |
| 6,759,310 B2 | 7/2004 | Hiroshi | |
| 6,990,132 B2 | 1/2006 | Kneissl et al. | |
| 7,271,417 B2 | 9/2007 | Chen | |
| 7,750,234 B2 | 7/2010 | Deng et al. | |
| 7,751,455 B2 | 7/2010 | Kneissl | |
| 7,923,275 B2 | 4/2011 | Nakagawa | |
| 7,928,448 B2 | 4/2011 | Wierer, Jr. et al. | |
| 7,989,323 B2 | 8/2011 | Shenai-Khatkhate | |
| 8,174,025 B2 | 5/2012 | Epler et al. | |
| 8,343,788 B2 | 1/2013 | Kuo et al. | |
| 8,344,409 B2 | 1/2013 | Peng et al. | |
| 8,497,171 B1 | 7/2013 | Wu et al. | |
| 8,507,925 B2 | 8/2013 | Kuo et al. | |
| 8,519,430 B2 | 8/2013 | Peng et al. | |
| 9,206,524 B2 | 12/2015 | Zhang et al. | |
| 9,356,187 B2 | 5/2016 | Ryu et al. | |
| 9,583,353 B2 | 2/2017 | Han | |
| 2002/0036295 A1 | 3/2002 | Nunoue et al. | |
| 2002/0070125 A1 | 6/2002 | Ng et al. | |
| 2002/0075929 A1* | 6/2002 | Cunningham | B82Y 20/00 372/50.1 |
| 2002/0153595 A1 | 10/2002 | Tayanaka | |
| 2002/0158265 A1* | 10/2002 | Eisenbeiser | H01S 5/183 257/98 |
| 2003/0178633 A1 | 9/2003 | Flynn et al. | |
| 2003/0180980 A1 | 9/2003 | Margalith et al. | |
| 2003/0189963 A1* | 10/2003 | Deppe | H01S 5/1833 372/96 |
| 2004/0021147 A1 | 2/2004 | Ishibashi | |
| 2004/0104398 A1 | 6/2004 | Hon et al. | |
| 2005/0029224 A1 | 2/2005 | Aspar et al. | |
| 2005/0184307 A1 | 8/2005 | Li et al. | |
| 2005/0224816 A1 | 10/2005 | Kim et al. | |
| 2005/0242365 A1 | 11/2005 | Yoo | |
| 2006/0046513 A1 | 3/2006 | Shea et al. | |
| 2006/0081832 A1 | 4/2006 | Chen | |
| 2006/0110926 A1 | 5/2006 | Hu et al. | |
| 2006/0199353 A1 | 9/2006 | Kub et al. | |
| 2007/0007241 A1 | 1/2007 | DeLouise | |
| 2007/0040162 A1 | 2/2007 | Song | |
| 2007/0085100 A1 | 4/2007 | Diana et al. | |
| 2007/0111345 A1 | 5/2007 | Wong et al. | |
| 2007/0194330 A1 | 8/2007 | Ibbetson et al. | |
| 2007/0284607 A1 | 12/2007 | Epler et al. | |
| 2008/0029773 A1 | 2/2008 | Jorgenson | |
| 2008/0067532 A1 | 3/2008 | Watson et al. | |
| 2008/0179605 A1 | 7/2008 | Takase et al. | |
| 2008/0280140 A1 | 11/2008 | Ferrari et al. | |
| 2008/0285610 A1* | 11/2008 | Hall | C03C 13/048 372/45.011 |
| 2008/0296173 A1 | 12/2008 | Mishra | |
| 2008/0298419 A1 | 12/2008 | Hori et al. | |
| 2009/0001416 A1 | 1/2009 | Chua et al. | |
| 2009/0117675 A1 | 5/2009 | Yamanaka et al. | |
| 2009/0140274 A1 | 6/2009 | Wierer, Jr. et al. | |
| 2009/0143227 A1 | 6/2009 | Dubrow et al. | |
| 2009/0168819 A1* | 7/2009 | Otoma | H01S 5/026 372/34 |
| 2009/0173373 A1 | 7/2009 | Walukiewicz et al. | |
| 2010/0142576 A1 | 6/2010 | Cohen et al. | |
| 2010/0195689 A1 | 8/2010 | Ariga et al. | |
| 2010/0246625 A1 | 9/2010 | Kawashima et al. | |
| 2010/0270649 A1 | 10/2010 | Ishibashi et al. | |
| 2010/0317132 A1 | 12/2010 | Rogers et al. | |
| 2011/0076854 A1 | 3/2011 | Takeo et al. | |
| 2011/0101391 A1 | 5/2011 | Miki et al. | |
| 2011/0188528 A1 | 8/2011 | Kisin et al. | |
| 2012/0018753 A1 | 1/2012 | Hao et al. | |
| 2012/0025231 A1 | 2/2012 | Krames et al. | |
| 2012/0068214 A1 | 3/2012 | Kuo et al. | |
| 2012/0189030 A1 | 7/2012 | Miyoshi | |
| 2012/0205665 A1 | 8/2012 | Nam et al. | |
| 2013/0011656 A1 | 1/2013 | Zhang et al. | |
| 2013/0050686 A1 | 2/2013 | Wunderer et al. | |
| 2013/0134457 A1 | 5/2013 | Peng et al. | |
| 2013/0140517 A1 | 6/2013 | Tang et al. | |
| 2013/0207237 A1 | 8/2013 | Weisbuch et al. | |
| 2013/0210180 A1 | 8/2013 | Wang | |
| 2013/0248911 A1 | 9/2013 | Hwang et al. | |
| 2013/0328102 A1 | 12/2013 | Peng et al. | |
| 2013/0334555 A1 | 12/2013 | Hsieh et al. | |
| 2014/0003458 A1 | 1/2014 | Han | |
| 2014/0048830 A1 | 2/2014 | Kuo et al. | |
| 2014/0064313 A1 | 3/2014 | Sato et al. | |
| 2014/0191369 A1 | 7/2014 | Tsuchiya et al. | |
| 2014/0203292 A1 | 7/2014 | Hwang et al. | |
| 2014/0339566 A1 | 11/2014 | Seo et al. | |
| 2016/0153113 A1 | 6/2016 | Zhang et al. | |
| 2016/0197151 A1 | 7/2016 | Han et al. | |
| 2017/0133826 A1 | 5/2017 | Han | |
| 2017/0237234 A1 | 8/2017 | Han et al. | |
| 2018/0152003 A1 | 5/2018 | Han et al. | |

FOREIGN PATENT DOCUMENTS

| | | |
|---|---|---|
| CN | 102823089 A | 12/2012 |
| CN | 103762286 A | 4/2014 |
| CN | 104205369 A | 12/2014 |
| JP | H05-315316 A | 11/1993 |
| JP | H10-135500 A | 5/1998 |
| JP | H11-195562 A | 7/1999 |
| JP | 2000-124552 A | 4/2000 |
| JP | 2000-349267 A | 12/2000 |
| JP | 2001-188264 A | 7/2001 |
| JP | 2001-223165 A | 8/2001 |
| JP | 2004-055611 A | 2/2004 |
| JP | 2005-244089 A | 9/2005 |
| JP | 2006-332595 A | 12/2006 |
| JP | 2007-073945 A | 3/2007 |
| JP | 2007-518075 A | 7/2007 |
| JP | 2007-335879 A | 12/2007 |
| JP | 2008-226974 A | 9/2008 |
| JP | 2009-055056 A | 3/2009 |
| JP | 2009-067658 A | 4/2009 |
| JP | 2009-094360 A | 4/2009 |
| JP | 2009-231833 A | 10/2009 |
| JP | 2009-239034 A | 10/2009 |
| JP | 2010-218510 A | 9/2010 |
| JP | 2012-049292 A | 3/2012 |
| JP | 2013-038394 A | 2/2013 |
| JP | 2013-518447 A | 5/2013 |
| JP | 2014-507069 A | 3/2014 |
| KR | 2000-0038997 A | 7/2000 |
| KR | 10-0480764 B1 | 6/2005 |
| WO | 2005/066612 A2 | 7/2005 |
| WO | WO 2009/048265 A1 | 4/2009 |
| WO | 2011/013621 A1 | 2/2011 |
| WO | WO 2011/094391 A1 | 8/2011 |
| WO | 2013/050686 A1 | 4/2013 |
| WO | 2014/061174 A1 | 4/2014 |

OTHER PUBLICATIONS

Ruoyuan et al. ("Wet oxidation of AlGaAs/GaAs distributed Bragg reflectors", Chinese Journal of semiconductors, vol. 26, No. 8, Aug. 2005).*

Pandey et al. ("Formation of self-organized anodic oxide from metallic gallium", Langmuir, 2012, 28 (38), pp. 13705-13711) (Year: 2012).*

Piprek, Blue light emitting diode exceeding 100% quantum efficiency. Phys Status Solidi RRL. 8, No. 5, Feb. 4, 2014 (Year: 2014).*

(56) References Cited

OTHER PUBLICATIONS

Bour et al., AlGaInN MQW Laser Diodes. III-V Nitride Semiconductors Applications and Devices. E.T. Yu (Ed.). Taylor and Francis Books, Inc., New York, NY, vol. 16, Chapter 10. 2003.
Bour et al., Design and performance of asymmetric waveguide nitride laser diodes. IEEE J Quantum Electron. 2000;36(2):184-191. doi: 10.1109/3.823464.
Chen et al., High reflectance membrane-based distributed Bragg reflectors for GaN photonics. Appl Phys Lett. 2012;101:221104.
Chen et al., Nanopores in GaN by electrochemical anodization in hydrofluoric acid: Formatio and mechanism. J Appl Physics. 2012;112:064303.
Dorsaz et al., Selective oxidation of AlInN layers for current confinement in Ill-nitride devices. Appl Phys Lett. 2005;87:072102.
Eiting et al., Growth of low resistivity p-type GaN by metal organic chemical vapour deposition. Electron Lett. Nov. 6, 1997;33(23):1987-1989. doi: 10.1049/el.19971257.
Higuchi et al., Room-Temperature CW Lasing of a GaN-Based Vertical-Cavity Surface-Emitting Laser by Current Injection. Appl Phys Express. 2008;1(12):121102. doi: 10.1143/APEX.1.121102.
Holder et al., Demonstration of nonpolar GaN-based vertical-cavity surface-emitting lasers. Proc SPIE 8639, Vertical-Cavity Surface-Emitting Lasers XVII, 863906. Mar. 13, 2013;doi:10.1117/12.2008277.
Jeon et al., Investigation of Mg doping in high-Al content p-type Al x Ga 1-x N (0.3<x<0.5). Appl Phys Lett. 2005;86:082107. doi: 10.1063/1.1867565.
Jiang et al., Semiconduct or lasers: Expanding into blue and green. Nat Photon. 2011;5:521-2.
Kasahara et al., Demonstration of Blue and Green GaN-Based Vertical-Cavity Surface-Emitting Lasers by Current Injection at Room Temperature. Appl Phys Express. 2011;4(7):072103. doi: 10.1143/APEX.4.072103.
Kozodoy et al., Enhanced Mg doping efficiency in Al 0.2 Ga 0.8 N/GaN superlattices. Appl Phys Lett. 1999;74:3681. doi: 10.1063/1.123220.
Laino et al., Substrate Modes of (Al,In)GaN Semiconductor Laser Diodes on SiC and GaN Substrates. IEEE J Quantum Electron. 2007;43(1):16-24. doi: 10.1109/JQE.2006.884769.
Lin et al., Current steering effect of GaN nanoporous structure. Thin Solid Films. Nov. 2014;570(Part B):293-7.
Lu et al., CW lasing of current injection blue GaN-based vertical cavity surface emitting laser. Applied Physics Lett. 2008;92:141102.
Nagahama et al., High-Power and Long-Lifetime InGaN Multi-Quantum-Well Laser Diodes Grown on Low-Dislocation-Density GaN Substrates. Jpn J Appl Phys. 2000;39, part 2(7a):L647. doi: 10.1143/JJAP.39.L647.
Nakamura et al., The Blue Laser Diode: The Complete Story. Springer. 2000. pp. 27, 238.
Nakayama et al., Electrical Transport Properties of p-GaN. Jpn J Appl Phys. 1996;35, Part 2(3A):L282. doi: 10.1143/JJAP.35.L282.
Okamoto et al., Pure Blue Laser Diodes Based on Nonpolar m-Plane Gallium Nitride with InGaN Waveguiding Layers. Jpn J Appl Phys. 2007;46:L820. doi: 10.1143/JJAP.46.L820.
Piprek, Efficiency droop in nitride-based light-emitting diodes. Physica Status Solidi A. Oct. 2010;207(10):2217-25.
Pourhashemi et al., High-power blue laser diodes with indium tin oxide cladding on semipolar (202⁻1⁻) GaN substrates. Appl Phys Lett. 2015;106:111105.
Sarzynski et al., Elimination of AlGaN epilayer cracking by spatially patterned AlN mask. Appl Phys Lett. 2006;88:121124.
Someya et al., Room temperature lasing at blue wavelengths in gallium nitride microcavities. Science. Sep. 17, 1999;285(5435):1905-6.
Tanaka et al., p-type conduction in Mg-doped GaN and Al0.08Ga0.92N grown by metalorganic vapor phase epitaxy. Appl Phys Lett. 1994;65:593. doi: 10.1063/1.112309.
Waldrip et al., Stress engineering during metalorganic chemical vapor deposition of AlGaN/GaN distributed Bragg Reflectors. Appl Phys Lett. 2001;78:3205.

Wierer et al., Comparison between blue lasers and light-emitting diodes for future solid-state lighting. Laser Photonics Rev. Nov. 2013;7(6):963-93.
Zhang et al., A conductivity-based selective etching for next generation GaN devices. Physica Status Solidi B. Jul. 2010;247(7):1713-6. doi: 10.1002/pssb.200983650.
Zhang et al., Confinement factor and absorption loss of AlInGaN based laser diodes emitting from ultraviolet to green. J Appl Phys. 2009;105:023104.
Zhang et al., Mesoporous GaN for Photonic Engineering—Highly Reflective GaN Mirrors as an Example. ACS Photonics. 2015;2(7):980-6.
Zheng et al., Synthesis of Ultra-Long and Highly Oriented Silicon Oxide Nanowires from Liquid Alloys. Adv Mater. Jan. 2002;14(2):122-4.
Zhou et al., Near ultraviolet optically pumped vertical cavity laser. Electron Lett. 2000;36:1777-9.
Choquette et al., Selective Oxidation of Buried AlGaAs for Fabrication of Vertical-Cavity Lasers. Conference: Spring meeting of the Materials Research Society (MRS), San Francisco, CA, Apr. 8-12, 1996. OSTI 244633. Jun. 1996. 10 pages.
U.S. Appl. No. 14/929,015 filed +Oct. 30, 2015, Zhang et al.
U.S. Appl. No. 15/515,302 filed /Mar. 29, 2017, Zhang et al.
U.S. Appl. No. 14/954,195 filed +Nov. 30, 2015, Han et al.
U.S. Appl. No. 15/574,739 filed +Nov. 16, 2017, Han et al.
International Search Report and Written Opinion for International Application No. PCT/US2013/046852, dated Oct. 29, 2013.
International Preliminary Report on Patentability for International Application No. PCT/US2013/046852, dated Jan. 8, 2015.
International Search Report and Written Opinion for International Application No. PCT/US2011/022701, dated Apr. 8, 2011.
International Preliminary Report on Patentability, dated Aug. 9, 2012 for Application No. PCT/US2011/022701.
Extended European Search Report for European Application No. 11737629.3, dated Oct. 12, 2017.
International Search Report and Written Opinion for International Application No. PCT/US2015/053254, dated Dec. 29, 2015.
International Preliminary Report on Patentability for International Application No. PCT/US2015/053254, dated Apr. 13, 2017.
Extended European Search Report for European Application No. 15846362.0, dated Apr. 24, 2018.
International Search Report and Written Opinion for International Application No. PCT/US2016/033270, dated Aug. 25, 2016.
International Preliminary Report on Patentability for International Application No. PCT/US2016/033270, dated Nov. 30, 2017.
Extended European Search Report for European Application No. 16797298.3, dated Dec. 3, 2018
Amano et al., P-Type Conduction in Mg-Doped GaN Treated with Low-Energy Electron Beam Irradiation (LEEBI). Jpn J Appl Phys. 1989;28:L2112-4.
Bernardini et al., Spontaneous polarization and piezoelectric constants of III-V nitrides. Phys. Rev. B. 1997;56(16):R10024-7.
Chen et al., Flexible, Compliant GaN Nanomembranes for Photonic Applications. 10th International Conference on Nitride Semiconductors. Abstract. Aug. 25, 2013. 2 pages.
Chung et al., Effect of Oxygen on the Activation of Mg Acceptor in GaN Epilayers Grown by Metalorganic Chemical Vapor Deposition. Jpn J Appl Phys. 2000;39(1,8):4749-50.
Gautier et al., Observations of Macroporous Gallium Nitride Electrochemically Etched from High Doped Single Crystal Wafers in HF Based Electrolytes. ECS J of Solid State Science and Technology. 2013;2(4):P146-P148.
Kamiura et al., Photo-Enhanced Activation of Hydrogen-Passivated Magnesium in P-Type GaN Films. Jpn J Appl Phys. 1998;37(2,8B):L970-1.
Kiefer et al., Si/Ge junctions formed by nanomembrane bonding. ACS Nano. Feb. 22, 2011;5(2): 1179-89. doi: 10.1021/nn103149c. Epub Jan. 19, 2011. 11 pages.
Kim et al., Reactivation of Mg acceptor in Mg-doped GaN by nitrogen plasma treatment. Appl Phys Lett. May 22, 2000;76(21):3079-81.

(56) References Cited

OTHER PUBLICATIONS

Krishnamoorthy et al., InGaN/GaN tunnel junctions for hole injection in GaN light emitting diodes. Appl Phys Lett. Jun. 10, 2014; 105(14): 141104. doi: 10.1063/1.4897342. 16 pages.
Kurokawa et al., Multijunction GaInN-based solar cells using a tunnel junction. Appl Phys Express. Mar. 3, 2014;7(3):034104.1-4.
Kuwano et al., Lateral Hydrogen Diffusion at p-GaN Layers in Nitride-Based Light Emitting Diodes with Tunnel Junctions. Jpn J Appl Phys. Aug. 20, 2013;52(8S):08JK12.1-3.
Myers et al., Diffusion, release, and uptake of hydrogen in magnesium-doped gallium nitride: Theory and experiment. J Appl Phys. Mar. 15, 2001;89(6):3195-202.
Nakamura et al., Hole Compensation Mechanism of P-Type GaN Films. Jpn J Appl Phys. May 1992;31(1,5A):1258-66.
Park et al., Doping selective lateral electrochemical etching of GaN for chemical lift-off. Jun. 5, 2009. Applied Physics Letters. AIP Publishing LLC, US. Vol. 94(22) pp. 221907-1-221907-3.
Park et al., High Diffuse Reflectivity of Nanoporous GaN Distributed Bragg Reflector Formed by Electrochemical Etching. Applied Physics Express. Jun. 14, 2013;6(7):072201-1-4.
Paskiewicz et al., Defect-free single-crystal SiGe: a new material from nanomembrane strain engineering. ACS Nano. Jul. 26, 2011;5(7):5814-22. doi: 10.1021/nn201547k. Epub Jun. 16, 2011.
Rogers et al., Synthesis, assembly and applications of semiconductor nanomembranes. Nature. Aug. 31, 2011;477(7362):45-53. doi: 10.1038/nature10381.
Sundararajan et al., Gallium nitride: Method of defect characterization by wet oxidation in an oxalic acid electrolytic cell. J Vac Sci Tech B. Sep. 27, 2002;20(4):1339-41.
Vajpeyi et al., High Optical Quality Nanoporous GaN Prepared by Photoelectrochemical Etching. Electrochemical and Solid-State Letters. 2005;8(4):G85-8.
Yam et al., Porous GaN prepared by UV assisted electrochemical etching. Thin Solid Films. Elsevier, Amsterdam, NL, Feb. 15, 2007; vol. 515(7-8), pp. 3469-3474.
Yam et al., Structural and optical characteristics of porous GaN generated by electroless chemical etching. Mater Lett. 2008;63:724-7.
Yerino et al., Shape transformation of nanoporous GaN by annealing: From buried cavities to nanomembranes. Appl Phys Lett. Jun. 2011;98(25):251910.1-3. doi: 10.1063/1.3601861.
Al-Heuseen et al., Effect of different electrolytes on porous GaN using photo-electrochemical etching. Applied surface science. May 1, 2011;257(14):6197-201.
Amano et al., I. P-type conduction in Mg-doped GaN treated with low-energy electron beam irradiation (LEEBI). Japanese Journal of Applied Physics. Dec. 1989;28(12A):L2112.
Beale et al., An experimental and theoretical study of the formation and micro structure of porous silicon. Journal of Crystal Growth, Dec. 1985 1;73(3):622-36.
Beale et al., Microstructure and formation mechanism of porous silicon. Applied Physics Letters. Jan. 1, 1985;46(1):86-8.
Bisi et al., Porous silicon: a quantum sponge structure for silicon based optoelectronics. Surface science reports. Apr. 1, 2000;38(1-3):1-126.
Chen et al., High-Q, Low-Threshold Monolithic Perovskite Thin-Film Vertical-Cavity Lasers. Advanced Materials. Apr. 2017;29(16): 1604781.
Chichibu et al., Origin of defect-insensitive emission probability in In-containing (Al, In, Ga) N alloy semiconductors. Nature materials. Oct. 2006;5(10):810-6.
Choquette et al., Vertical-cavity surface emitting lasers: moving from research to manufacturing. Proceedings of the IEEE, Nov. 1997;85(11): 1730-9.
Cullis et al., The structural and luminescence properties of porous silicon. Journal of applied physics. Aug. 1, 1997;82(3):909-65.
Davis et al., Ordered porous materials for emerging applications. Nature. Jun. 2002;417(6891):813-21.

Feng et al., Genetic history of Xinjiang's Uyghurs suggests bronze age multiple-way contacts in Eurasia. Molecular Biology and Evolution, Oct. 1, 2017;34(10):2572-82.
Föll et al., Macroporous semiconductors. Materials. May 2010;3(5):3006-76.
Gautier et al., Porous silicon in microelectronics: From academic studies to industry. ECS Transactions. Sep. 18, 2015;69(2):123.
Hamaguchi et al., Milliwatt-class GaN-based blue vertical-cavity surface-emitting lasers fabricated by epitaxial lateral overgrowth, physica status solidi (a). May 2016;213(5):1170-6.
Han et al., Single-Crystalline, Nanoporous Gallium Nitride Films With Fine Tuning of Pore Size for Stem Cell Engineering. Journal of Nanotechnology in Engineering and Medicine. Nov. 1, 2014;5(4):040903-1.
Huang et al., Mechanical properties of nanoporous GaN and its application for separation and transfer of GaN thin films. ACS Applied Materials & Interfaces. Nov. 13, 2013;5(21):11074-9.
Jasim et al., The Size Effect in Small Aperture Confined Vertical Cavity Surface Emitting Laser. AIP Conference Proceedings. Jun. 1, 2009;1136(1):103-7.
Kuramoto et al., Enhancement of slope efficiency and output power in GaN-based verticalcavity surface-emitting lasers with a SiO2-buried lateral index guide. Applied Physics Letters. Mar. 12, 2018;112(11):111104.
Kuwano et al., Lateral hydrogen diffusion at p-GaN layers in nitride-based light emitting diodes with tunnel junctions. Japanese Journal of Applied Physics. Aug. 20, 2013;52(8S):08JK12.
Langa et al., Waveguide structures based on porous indium phosphide. Electrochemical and Solid State Letters. Dec. 23, 2004;8(2):C30.
Lee et al., Enhanced performance of InGaN/GaN multiple-quantum-well light-emitting diodes grown on nanoporous GaN layers. Optics Express. Jun. 30, 2014;22(104):A1164-73.
Lee et al., Fast fabrication of long-range ordered porous alumina membranes by hard anodization. Nature materials. Sep. 2006;5(9):741-7.
Lee et al., Optically pumped GaN vertical cavity surface emitting laser with high index-contrast nanoporous distributed Bragg reflector. Optics express. May 4, 2015;23(9): 11023-30.
Lin et al., Fabrication of current confinement aperture structure by transforming a conductive GaN: Si epitaxial layer into an insulating GaOx layer. ACS Applied Materials & Interfaces. Dec. 24, 2014;6(24):22235-42.
Mynbaeva et al., Strain relaxation in GaN layers grown on porous GaN sublayers. Materials Research Society Internet Journal of Nitride Semiconductor Research, 1999;4(1).
Mynbaeva et al., Structural characterization and strain relaxation in porous GaN layers. Applied Physics Letters. Feb. 28, 2000;76(9):1113-5.
Schwab et al., Aligned mesopore arrays in GaN by anodic etching and photoelectrochemical surface etching. The Journal of Physical Chemistry C. Aug. 22, 2013;117(33): 16890-5.
Searson et al., Pore morphology and the mechanism of pore formation in n-type silicon. Journal of applied physics. Jul. 1, 1992;72(1):253-8.
Sharizal et al., Effect of oxide aperture on the performance of 850 nm vertical-cavity surface-emitting lasers. Optik, Jan. 1, 2009;120(3):121-6.
Smith et al., A theoretical model of the formation morphologies of porous silicon. Journal of Electronic Materials. Nov. 1, 1988;17(6):533-41.
Smith et al., Porous silicon formation mechamsms. Journal of Applied Physics. Apr. 15, 1992;71(8):R1-22.
Wang et al., Fabrication and properties of nanoporous GaN films. Applied physics letters. Aug. 2, 2004;85(5):816-8.
Yang et al., Improving light output power of InGaN-based light emitting diodes with pattern-nanoporous p-type GaN: Mg surfaces. Applied Physics Letters. Nov. 17, 2008;93(20):203103.
Yuan et al., Optical engineering of modal gain in a III-nitride laser with nanoporous GaN. ACS Photonics. Sep. 21, 2016;3(9): 1604-10.
Zhang et al., A resonant-cavity blue-violet light-emitting diode with conductive nanoporous distributed Bragg reflector, physica status solidi (a). Aug. 2017;214(8): 1600866.

(56) References Cited

OTHER PUBLICATIONS

Zhang et al., Toward quantitative electrochemical nanomachining of III-nitrides. Journal of The Electrochemical Society. Jul. 28, 2018;165(10):E513-20.
Zhang, Mechanism of pore formation on n-type silicon. Journal of the Electrochemical Society. Dec. 1, 1991;138(12):3750-6.
Zhang, Nanoporous GaN and Its Application in Vertical-Cavity Surface-Emitting Lasers. Yale University PhD Dissertation, May 2019:248 pages.

* cited by examiner

METHOD FOR A GAN VERTICAL MICROCAVITY SURFACE EMITTING LASER (VCSEL)

RELATED APPLICATIONS

This application claims the benefit of U.S. provisional Application Ser. No. 61/980,313, titled "A Method for a GaN Vertical Microcavity Surface Emitting Laser (VCSEL)," filed on Apr. 16, 2014. The entire disclosure of the foregoing application is incorporated herein by reference.

GOVERNMENT FUNDING

This invention was made with government support under Grant No. CMMI-1129964 awarded by the National Science Foundation. The government has certain rights in the invention.

BACKGROUND

Technical Field

The technology relates to methods and structures for making vertical-cavity light-emitting devices.

Discussion of the Related Art

Early types of semiconductor laser diodes that are still in use today, known as edge-emitting laser diodes, are designed to emit radiation from an edge of a laser diode chip. In these devices, the direction or beam axis of the laser cavity and the direction of the emitted lasing beam are parallel to a "process" plane of the semiconductor substrate on which the edge-emitting lasers are formed. Typically, after the laser diodes are formed, the substrate is diced or cleaved to form a laser diode chip, the chip is packaged, a current is applied across the laser diode's junction, and laser radiation is emitted from an edge of the chip.

A vertical cavity surface emitting laser (VCSEL) is a type of semiconductor laser that was conceptualized and developed in the 1980s and '90s. VCSELs are characterized by the formation of a vertical laser cavity that is oriented perpendicular to the process plane of the substrate on which the laser is formed. The laser cavity may be defined by two parallel optical reflectors sandwiching an active region of the laser diode. VCSELs may also be diced from a substrate and packaged. Lasing radiation for a VCSEL is emitted in a direction that is out of the process plane of the chip, and is perpendicular to the direction of emission for an edge-emitting laser diode.

Compared with conventional edge-emitting laser diodes, a VCSEL may have advantages of (1) on-wafer testing of device performance, (2) better beam profile and far-field patterns, (3) better mode stability and wider free spectral range due to a shorter cavity length, (4) possibility of a very low threshold current, (5) a generally higher manufacturing yield, (6) a higher packing density on a substrate and therefore lower cost, and (7) improved compatibility with planar microfabrication techniques. VCSELs in the infrared and red spectral range are currently being used for telecommunication and industrial applications.

SUMMARY

Methods and structures associated with fabricating vertical light-emitting devices such as VCSELs are described. The methods may be used to fabricate VCSELs from III-nitride materials such as gallium nitride (GaN). Conductivity-based electrochemical (EC) etching may be used during fabrication to form a semiconductor/air distributed Bragg reflector and a current-guiding structure on the bottom side of a vertical light-emitting device. The current-guiding structure may enhance a spatial overlap between an active region of the device (where carrier recombination takes place) and a resonant cavity of the device. The current-guiding structure may be formed from a portion of a semiconductor layer that is first converted to porous semiconductor, and then converted to a porous oxide.

According to some embodiments, a semiconductor light-emitting device comprises a substrate, an active region comprising semiconductor material, wherein the active region has a first area, a doped semiconductor region located between the active region and the substrate having a second area smaller than the first area, and a porous oxide extending around the doped semiconductor region and located between the active region and the substrate. At least a portion of the active region may be configured for carrier recombination and photon generation.

According to some aspects, the active region and doped semiconductor region comprise III-nitride material. In some implementations, the porous oxide may comprise gallium oxide, aluminum-gallium oxide, or indium-gallium oxide. In some aspects, the porous oxide may be formed in and from a same layer of material as the doped semiconductor region. In some implementations, the doped semiconductor region comprises n-type conductivity material. In some aspects, the active region may be configured to produce photons when electrical current flows through the active region. According to some implementations, the active region comprises multiple quantum wells formed from layers of III-nitride material.

In some aspects, a semiconductor light-emitting device may further comprise a contact layer of semiconductor material formed between the doped semiconductor region and the substrate, wherein a doping density of the contact layer is less than a doping density of the doped semiconductor region. In some implementations, a doping density of the contact layer is between approximately $5 \times 10^{17}$ cm$^{-3}$ and approximately $2 \times 10^{18}$ cm$^{-3}$ and a doping density of the doped semiconductor region is between approximately $3 \times 10^{18}$ cm$^{-3}$ and approximately $1 \times 10^{19}$ cm$^{-3}$.

In some implementations, a semiconductor light-emitting device may further comprise a first distributed Bragg reflector located between the doped semiconductor region and the substrate. The first distributed Bragg reflector may comprise alternating layers of air and III-nitride material. In some aspects, a semiconductor light-emitting device may further include at least one undoped semiconductor layer between the doped semiconductor region and the first distributed Bragg reflector. In some cases, a semiconductor light-emitting device may further comprise a conductive layer having a doping density between approximately $5 \times 10^{17}$ cm$^{-3}$ and approximately $2 \times 10^{18}$ cm$^{-3}$ located between the doped semiconductor region and the first distributed Bragg reflector, and an undoped semiconductor layer between the conductive layer and the first distributed Bragg reflector, wherein a doping density of the doped semiconductor region is between approximately $3 \times 10^{18}$ cm$^{-3}$ and approximately $1 \times 10^{19}$ cm$^{-3}$.

According to some implementations, a semiconductor light-emitting device may further comprise a second distributed Bragg reflector located on a side of the active region away from the substrate. In some aspects, the second distributed Bragg reflector may comprise layers of dielectric material.

The foregoing aspects, implementations, and features may be included in any suitable combination in an embodiment of a semiconductor light-emitting device, and may be included in any suitable combination in one or more of the following method embodiments for making an integrated light-emitting device.

According to some embodiments, a method for making an integrated light-emitting device may comprise acts of forming a mesa on a substrate that comprises an active region of semiconductor material and a doped semiconductor layer located between the active region and substrate, etching a portion of the doped semiconductor layer to form a porous semiconductor region extending around a remaining doped and unetched semiconductor region, wherein the porous semiconductor region and doped semiconductor region are located between the active region and the substrate, and converting the porous semiconductor region to a porous oxide.

In some aspects, forming the doped semiconductor layer may comprise epitaxially growing an n-type conductivity layer of III-nitride material. A method may further include forming a contact layer of semiconductor material adjacent the doped semiconductor layer, wherein a doping density of the contact layer is less than a doping density of the doped semiconductor layer. In some implementations, a method may further include forming the doped semiconductor layer and contact layer from III-nitride material, doping the contact layer with a doping density between approximately $5 \times 10^{17}$ cm$^{-3}$ and approximately $2 \times 10^{18}$ cm$^{-3}$, and doping the doped semiconductor layer with a doping density between approximately $3 \times 10^{18}$ cm$^{-3}$ and approximately $1 \times 10^{19}$ cm$^{-3}$.

According to some implementations, the etching comprises electrochemical etching with a hydrofluoric-based etchant. The etching may further comprise applying a bias between approximately 7 volts and approximately 20 volts between the semiconductor layer and an electrode in the etchant. In some aspects, converting the porous semiconductor region comprises oxidizing the porous semiconductor to form gallium oxide.

In some implementations, a method for making an integrated light-emitting device may further comprise forming a first distributed Bragg reflector located between the doped semiconductor region and the substrate. The act of forming the first distributed Bragg reflector may comprise epitaxially growing one or more layers of n-type III-nitride semiconductor material and on or more layers of undoped III-nitride semiconductor material, etching a hole adjacent the mesa to expose sidewalls of the layers of n-type III-nitride semiconductor material, and electrochemically etching at least a portion of the layer or layers of n-type III-nitride semiconductor material to form at least one air gap between the mesa and the substrate.

In some implementations, the layer or layers of n-type III-nitride semiconductor material comprise GaN and have a doping density between approximately $8 \times 10^{18}$ cm$^{-3}$ and approximately $5 \times 10^{19}$ cm$^{-3}$. The etching a portion of the doped semiconductor layer and electrochemically etching at least a portion of the layer or layers of n-type III-nitride semiconductor material may be performed in a same etching step. A method for making an integrated light-emitting device may further comprise forming at least one undoped semiconductor layer between the doped semiconductor region and the first distributed Bragg reflector.

In some implementations, a method may further comprise forming a second distributed Bragg reflector located on a side of the active region away from the substrate. Forming the second distributed Bragg reflector may comprise depositing layers of dielectric material.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabrication of integrated devices, only one device may be shown to simplify the drawings. In practice, a large plurality of devices may be fabricated in parallel. The drawings are not intended to limit the scope of the present teachings in any way.

Figure 1:
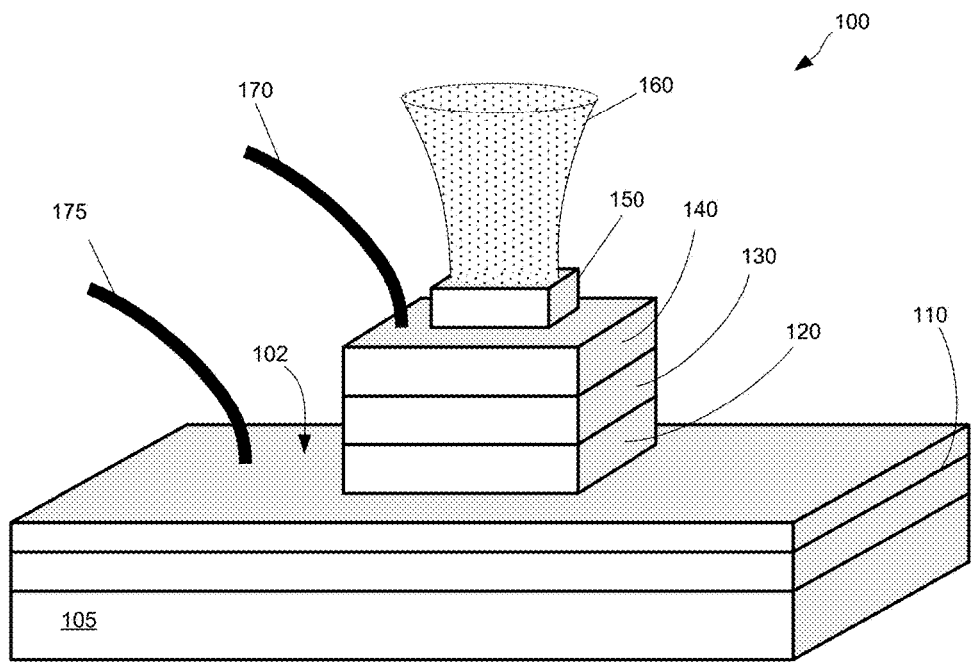
FIG. 1 is a perspective view depicting a vertical-cavity light-emitting device, according to some embodiments.

When referring to the drawings in the following detailed description, spatial references "top," "bottom," "upper," "lower," "vertical," "horizontal," and the like may be used. For example, "vertical" may be used to refer to a direction normal to the substrate surface, and "horizontal" may be used to refer to a direction parallel to the substrate surface when referring to the drawings. "Upper," "top," or "above" may be used to refer to a vertical direction away from the substrate, whereas "lower," "bottom," or "below" may be used to refer to a vertical direction toward the substrate. Such references are used for teaching purposes, and are not intended as absolute references for embodied devices. An embodied device may be oriented spatially in any suitable manner that may be different from the orientations shown in the drawings.

The features and advantages of the embodiments will become more apparent from the detailed description set forth below when taken in conjunction with the drawings.

DETAILED DESCRIPTION

Among the various types of vertical-cavity light-emitting devices possible with the processes described herein, a GaN VCSEL is expected to be an important new device configuration for high-end lighting applications such as automobile headlight, micro-projector, and low-droop, high-power lamps. A GaN VCSEL can access the purple/blue spectral range (400-450 nm), which is useful for high-brightness white-light sources. Currently, difficulties associated with fabricating vertical cavities in III-nitride systems have impeded the commercial realization of GaN VCSELs.

FIG. 1 depicts a simplified diagram of a vertical-cavity light-emitting device 100. A vertical-cavity light-emitting device 100 may be a VCSEL or a resonant-cavity light-emitting diode, and may be formed on a process plane 102 of a substrate 105. The process plane of a substrate may be a side or surface of the substrate on which layers are deposited and processed to form one or more integrated devices. A light-emitting device 100 may include at least one n-side semiconductor layer 120, at least one p-side semiconductor layer 140, and an active region 130 in which photons are generated. A light-emitting device may further include a bottom-side reflector (not shown) and top-side reflector 150 that may form a laser cavity. In some implementations, only a bottom-side reflector may be used to redirect light emission away from the substrate, e.g., to improve emission from a light-emitting diode (LED). Electrical wires 170, 175 or integrated interconnects may electrically connect to p- and n-side contacts for applying a bias across the device. When biased, recombining carriers in the active region 130 generate photons, and a beam of radiation 160 emits vertically from the device.

A vertical-cavity light-emitting device that is formed as a VCSEL may include bottom-side and top-side reflectors. The principle of light amplification in a VCSEL is not very different from that in conventional laser diodes. Applying electrical bias across the laser diode's p- and n-type layers and active region causes the injection of electrons and holes from the n-type 120 and p-type 140 layers, respectively, into the active region 130. The electrons and holes recombine radiatively to create photons, or electromagnetic radiation. Under a sufficiently high level of current injection, the active region 130 can reach population inversion and photon amplification by stimulated emission can occur. If the cavity reflectors have a sufficiently high reflectance, round-trip gain in the laser cavity may equal round-trip loss so that continuous-wave lasing operation is sustained producing an output laser beam 160.

In some implementations, a laser cavity for a VCSEL may be formed as a microcavity. A microcavity may have a length L that has a value similar to or within a factor of 5 of the lasing wavelength for the VCSEL. A length of a microcavity may be an integral number of half-wavelengths, according to some embodiments, where the length accounts for refractive indices of materials within the microcavity. For example, the cavity reflectors are effectively located at nodes of a standing optical wave that is amplified within the laser cavity. In some embodiments, a microcavity VCSEL may have a distance L between its cavity reflectors between approximately 80 nanometers and approximately 2 microns. The behavior of electromagnetic waves inside a microcavity may be defined by allowable longitudinal optical modes of the microcavity. For example, photons in certain allowed modes will be amplified through stimulated emission, leading to highly efficient generation of coherent photons.

The inventors have recognized and appreciated that successful fabrication of vertical-cavity light-emitting devices may include (1) forming an efficient active region for carrier-photon conversion, (2) forming integrated, high-quality reflectors on opposing sides of the active region, and (3) controlling spatial flow of current through the active region such that photon production by carrier recombination overlaps well with modes of a resonant cavity formed by the high-quality reflectors. The inventors have observed that since 1999, there have been few demonstrations of VCSEL operation in III-nitride materials, and believe this is primarily due to fabrication challenges posed by the integrated reflectors (item 2), and more particularly the bottom-side reflector. Although their have been limited demonstrations of III-nitride VCSELs, these devices are not yet commercially available.

Two teams (Tokyo University and Sandia Labs/Brown University) demonstrated the use of epitaxial AlGaN/GaN distributed Bragg reflectors (DBR) as the bottom-side reflectors with dielectric oxide stacks as the top-side reflectors. This hybrid configuration led to the first demonstration of an electrically-injected VCSEL in 2008. However, the inventors recognize that preparation of the bottom DBRs by epitaxy is very difficult. A large number (40 to 60) of AlGaN/GaN pairs are required to achieve a high reflectivity (R~99%) due to the very low contrast of index of refraction between AlGaN and GaN layers. Also, the control of strain induced by epitaxial growth of the different layers is another significant challenge for that reflector structure. Further, the AlGaN/GaN multi-layer reflector has a very narrow bandwidth (~15 nm), which makes it difficult to fabricate the structure to match allowed lasing wavelengths for the VCSEL.

In another approach, Nichia Chemical used a laser liftoff (LLO) technique to separate an InGaN/GaN p-n epitaxial structure from a sapphire substrate, and to expose the bottom side (n-side) for the deposition of a dielectric mirror. Although this approach can avoid the complexity of a multi-layer epitaxial DBR reflector, the use of LLO adds other processing complexity, and it essentially voids the advantage of on-wafer testing. Further, LLO typically requires a relatively thick active region for the laser, which increases the cavity length and reduces the mode spacing for a laser. This can degrade the longitudinal mode quality of a VCSEL.

In both of these approaches for fabricating VCSELs, a dielectric current-blocking layer was employed on the p-side or top-side of the device. The inventors have recognized and appreciated that current diffusion on the n-side or bottom-side could undermine device performance, and that implementing current blocking on the bottom-side poses fabrication challenges. For example, addition of an oxide blocking layer can disrupt epitaxial growth.

The inventors have conceived of methods and structures for fabricating vertical-cavity light-emitting devices that include bottom-side, wide-band, high-reflectance mirrors and bottom-side current-guiding structures that can prevent unwanted current spreading at the active region. In some embodiments, the methods and structures may be used for manufacturing III-nitride VCSEL devices with reduced complexity and allow for on-wafer testing. According to some embodiments, a bottom-side or n-side reflector may be formed through lateral electrochemical (EC) etching as a GaN/air multilayer DBR. Because of the refractive index contrast for the semiconductor/air DBR, the bottom-side reflector exhibits a wider bandwidth (~150 nm) with only four layer pairs than conventional AlGaN/GaN DBR structures having 40 to 60 layer pairs. Additionally, a bottom-side current-guiding and blocking layer may be formed by lateral porosification of highly-doped GaN to a selected distance using EC etching, followed by a controlled oxidation to convert the nanoporous GaN to an insulating nanoporous gallium oxide.

The processes described below may be used with various types of III-nitride materials (e.g., GaN and GaN alloys such as InGaN, AlGaN, InGaAlN, etc.) When other III-nitride materials are used, the conversion of nanoporous material may result in other oxides, e.g., indium-gallium oxide, aluminum-gallium oxide, indium-gallium-aluminum oxide, etc. In other implementations, the processes may be extended to other semiconductor systems (e.g., Si, SiC, InP, GaAs, and their respective alloys) for which EC etching conditions are known.

Figure 2A:
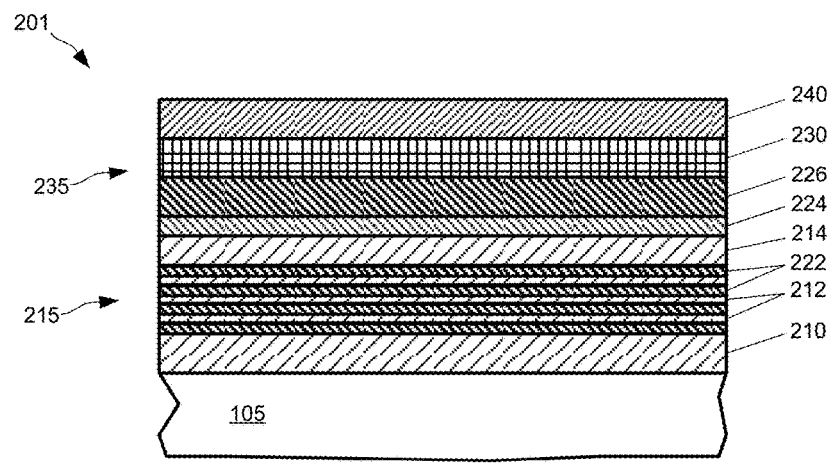
FIGS. 2A-2F depict, in elevation view, structures associated with processes for forming vertical-cavity light-emitting devices, according to some embodiments.
Figure 2B:
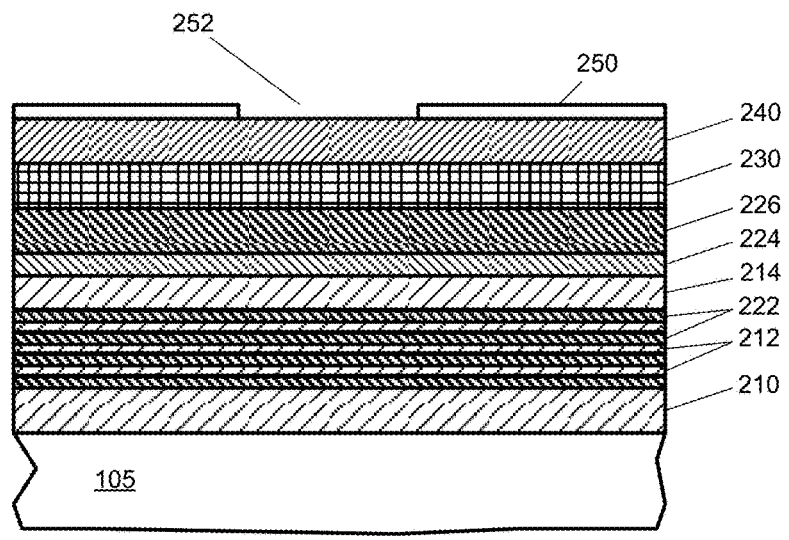
Figure 2C:
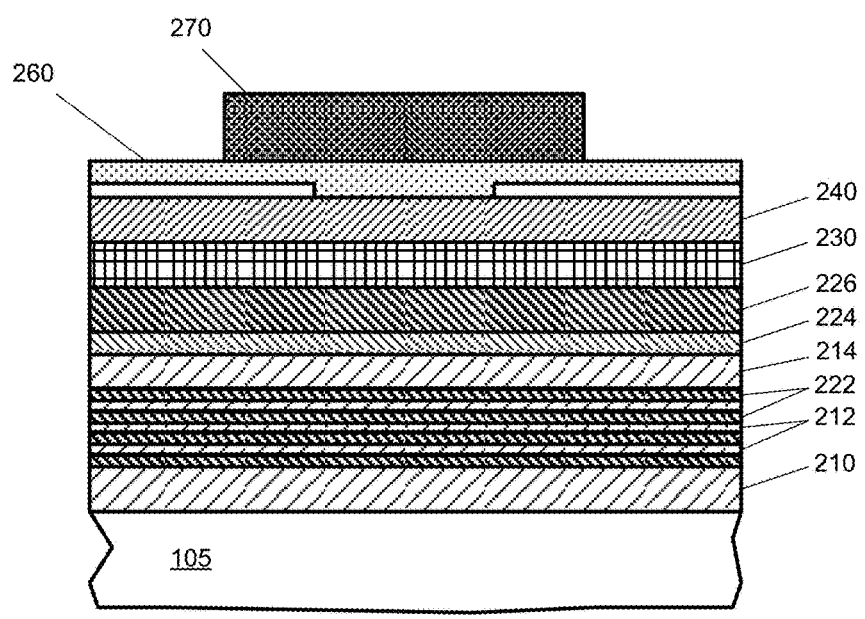
Figure 2D:
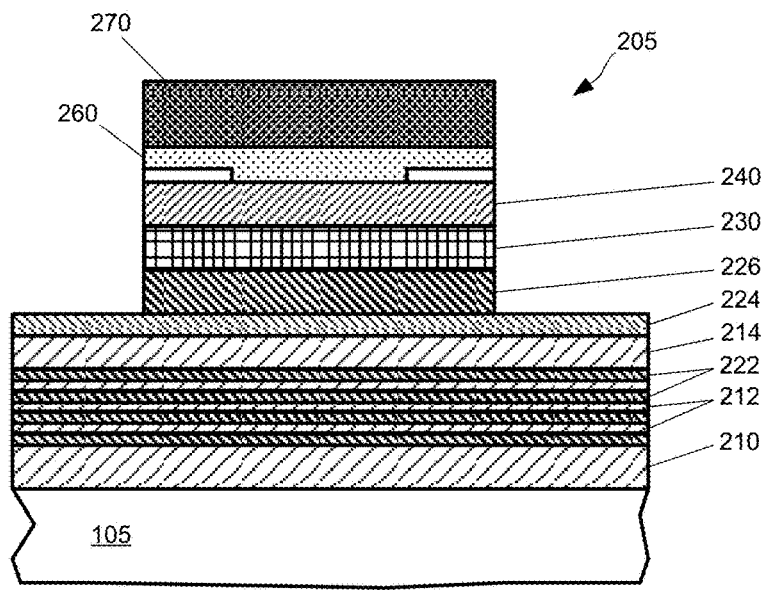
Figure 2E:
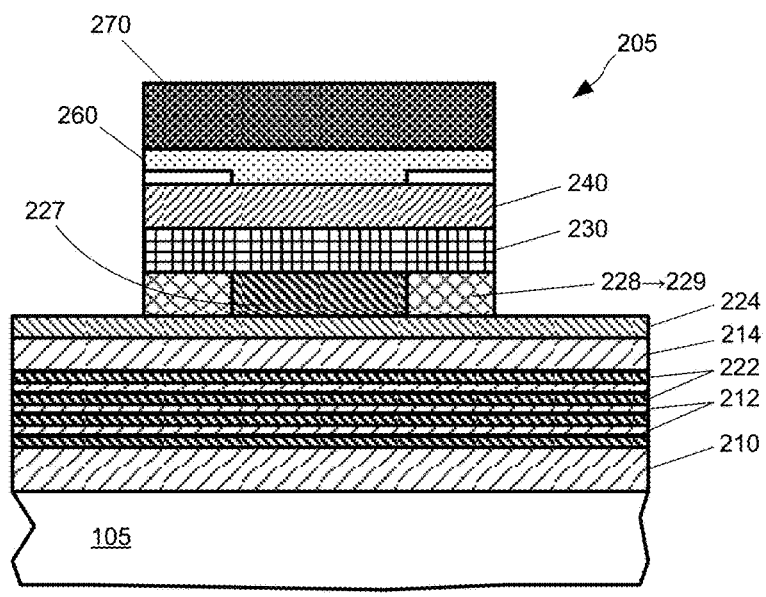
Figure 2F:
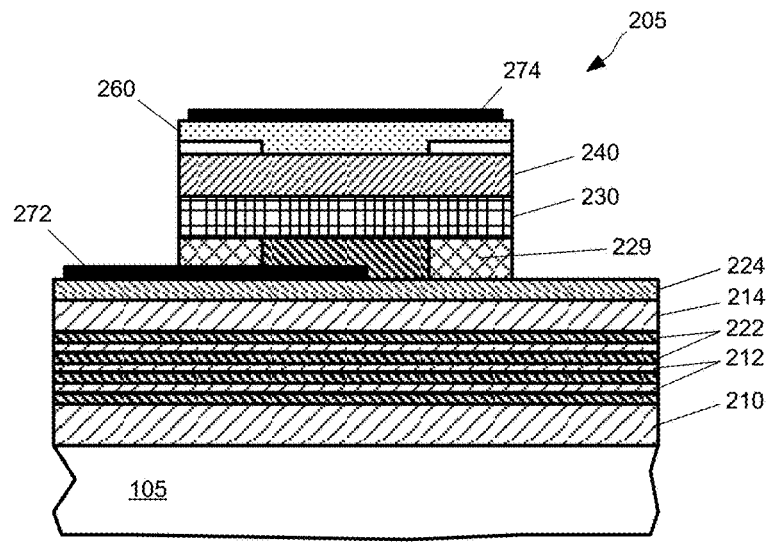
Figure 2G:
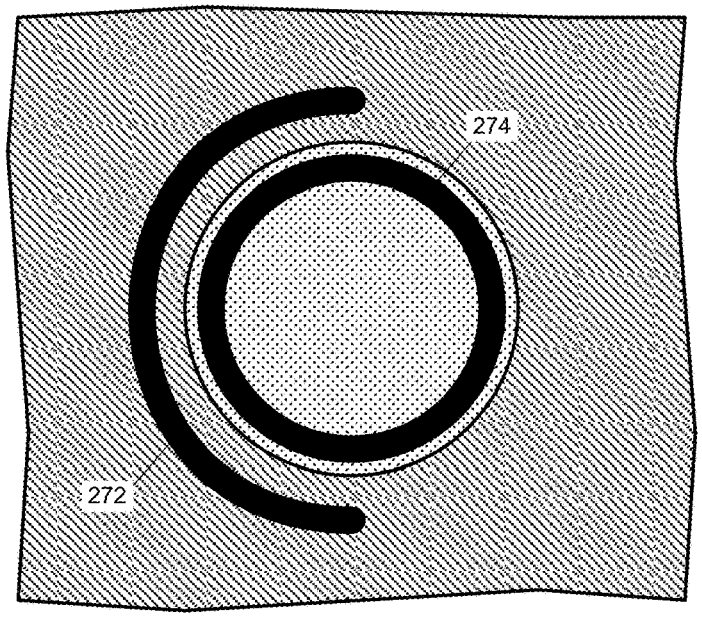
FIG. 2G depicts, in plan view, contact pads for a vertical-cavity light-emitting device, according to some embodiments.
Figure 2H:
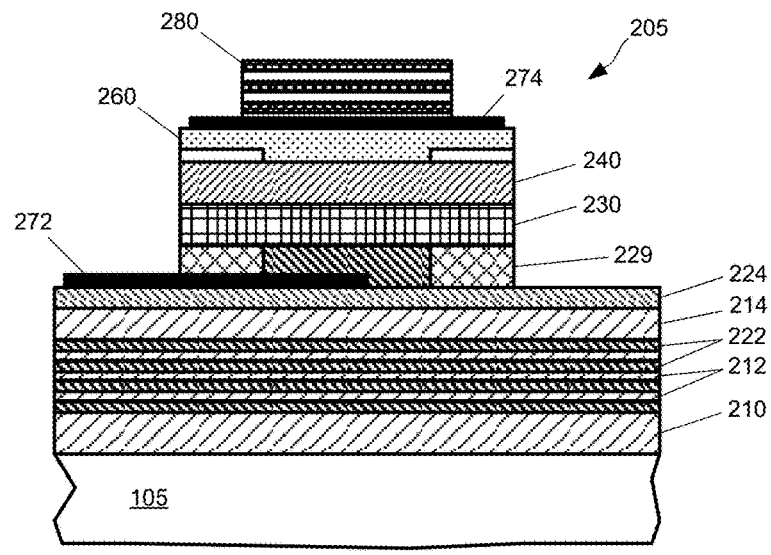
FIGS. 2H-2J depict, in elevation view, structures associated with processes for forming vertical-cavity light-emitting devices, according to some embodiments.
Figure 2I:
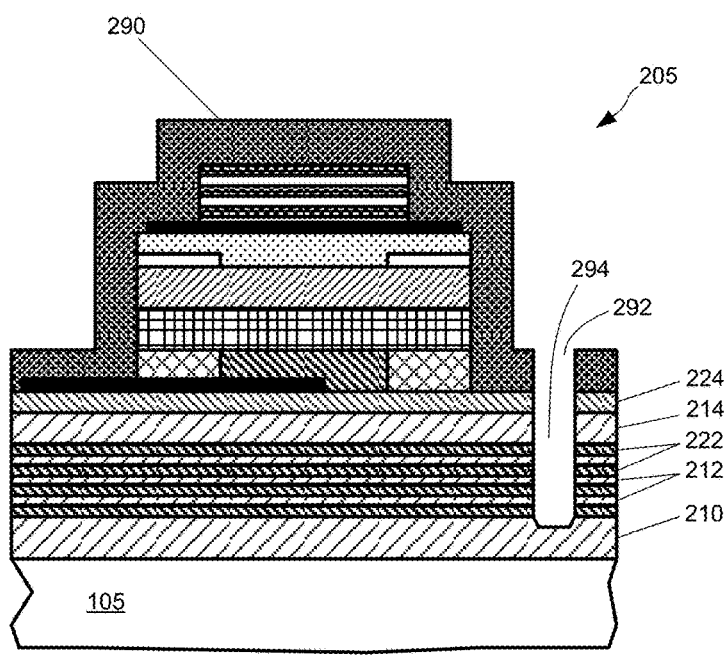
Figure 2J:
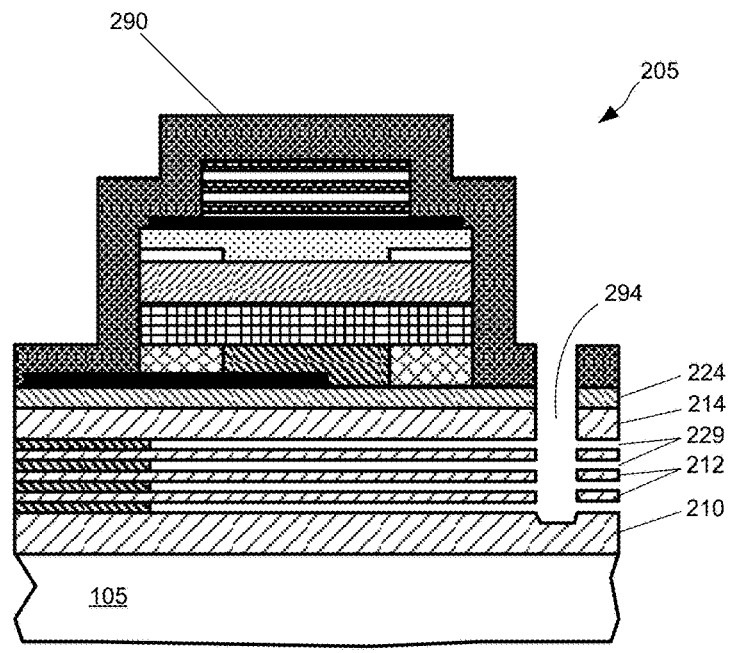
Figure 2K:
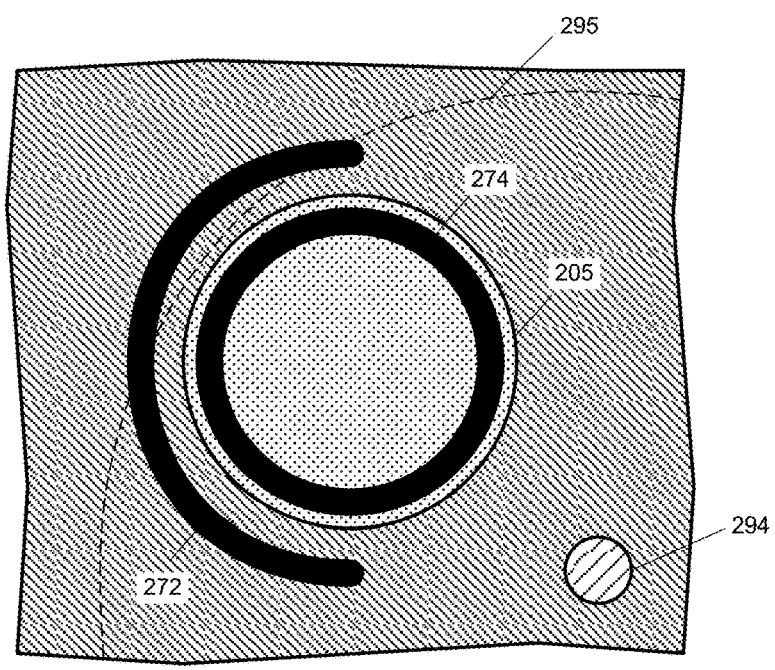
FIG. 2K-2L depict, in plan view, structures associated with processes for forming vertical-cavity light-emitting devices, according to some embodiments.
Figure 2L:
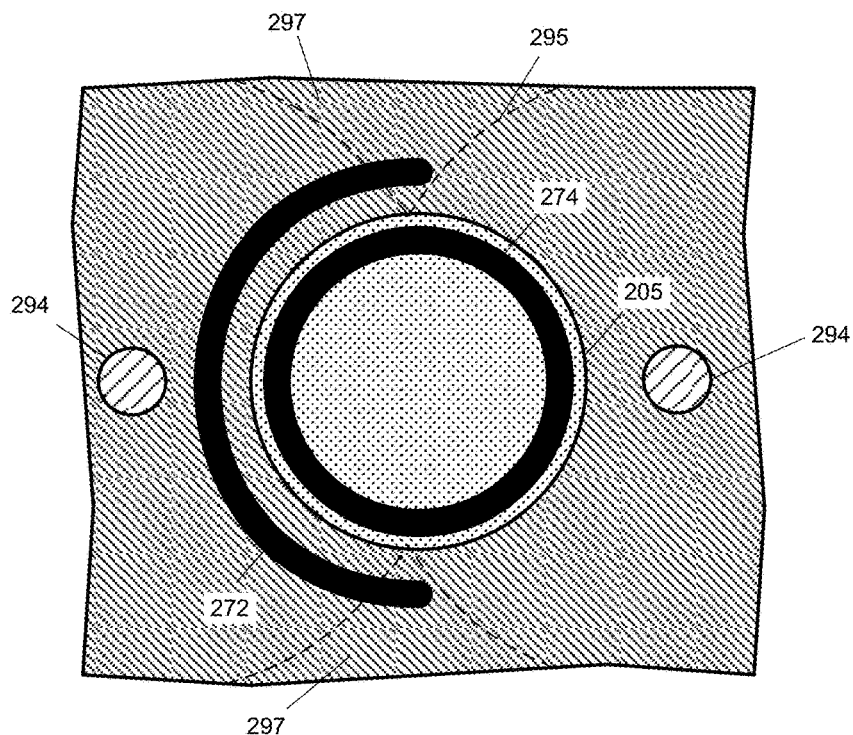
Figure 2M:
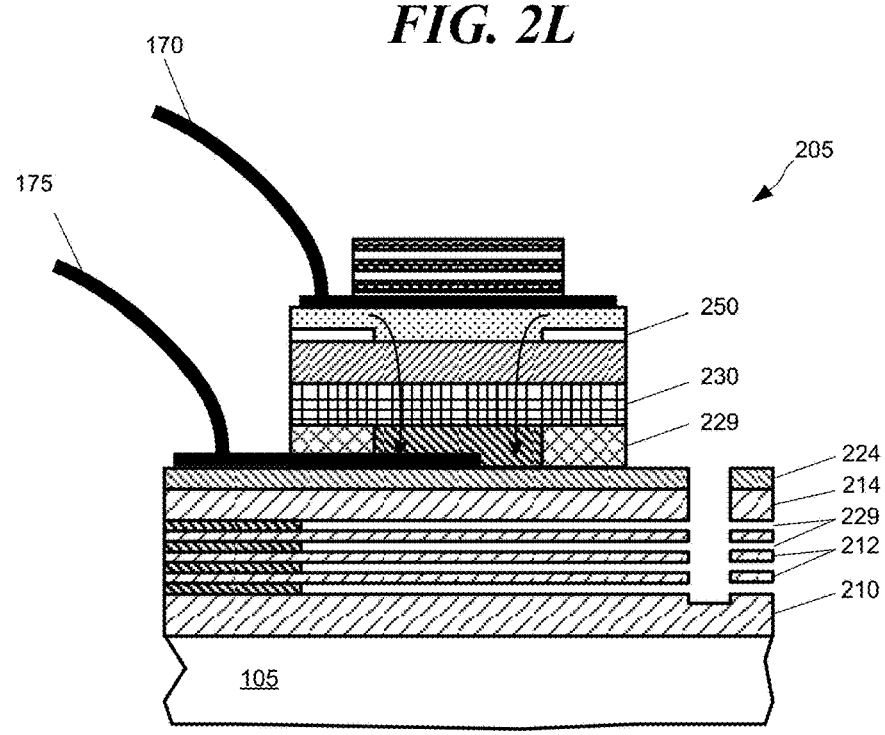
FIGS. 2M-2N depict, in elevation view, structures associated with processes for forming vertical-cavity light-emitting devices, according to some embodiments.
Figure 2N:
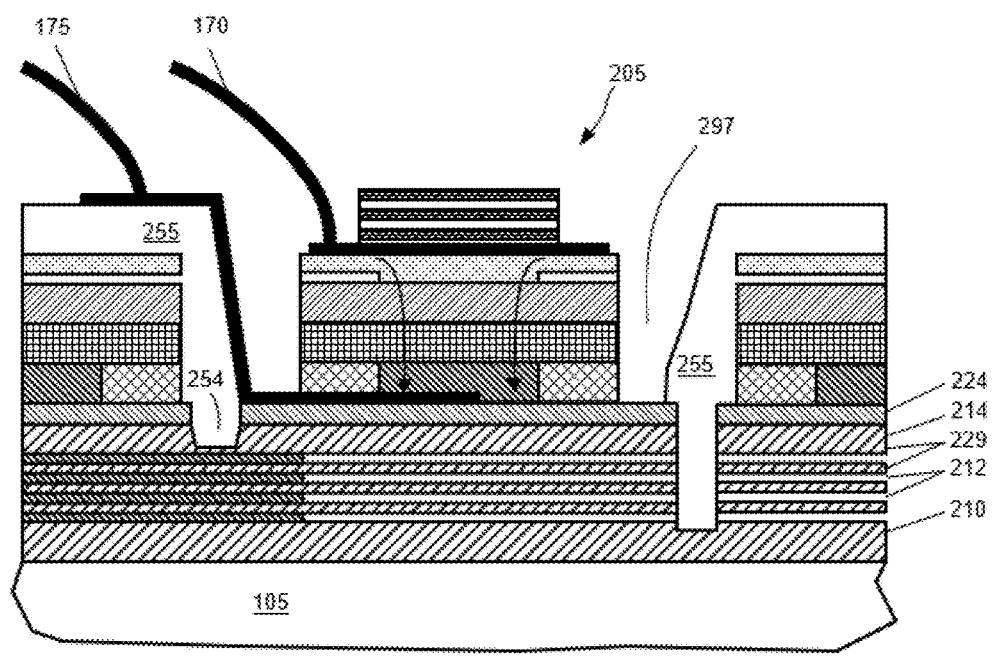

FIG. 2A-2N depicts structures associated with process steps for manufacturing vertical-oriented light-emitting devices, according to some embodiments. The processes and structures may be used to form VSCELs or vertical resonant-cavity LEDs, according to some embodiments. Alternatively, some of the processes and structures may be used to form vertical-oriented LEDs with a bottom-side reflector, in some implementations. The bottom-side reflectors, bottom-side current-guiding structures, and devices may be formed from III-nitride materials. Although the following description primarily identifies GaN as used for forming a VCSEL, other III-nitride materials may be used additionally or alternatively, e.g., (Al, In, Ga)N materials.

According to some embodiments, a vertical-oriented light-emitting device may be fabricated using a multilayer structure 201 comprising a substrate 105, as depicted in FIG. 2A. The substrate 105 may comprise a semiconductor (e.g., Si, SiC, GaN) in some embodiments, a crystalline material (e.g., $Al_2O_3$) in some embodiments, a ceramic in some implementations, or any suitable substrate on which integrated-circuit grade, semiconductor layers may be formed or bonded. The multilayer structure may include reflector layers 215 and device layers 235 formed adjacent the reflector layers. There may be one or more intervening layers between the reflector layers and adjacent device layers.

According to some embodiments, a base layer 210 may be epitaxially grown from the substrate 105 or from a buffer layer (e.g., AlN, SiC, $Al_2O_3$) deposited on a substrate. In some embodiments, the base layer may be bonded to the substrate 105. The base layer may comprise a III-nitride material that is undoped, according to some embodiment. For example, the base layer 210 may comprise undoped or unintentionally-doped gallium nitride (u-GaN). A doping density of the base layer may be less than $10^{17}$ $cm^{-3}$.

In some implementations, the base layer 210 may be between approximately 100 nm and approximately 2 microns thick. The base layer may be grown to a thickness for which a density of defects (resulting from epitaxial growth of a lattice-mismatched semiconductor) reduces to levels acceptable for integrated-circuit devices. For example, a density of defects at a top surface of the base layer 210 may be less than about $10^9$ defects $cm^{-2}$ in some embodiments, less than about $10^6$ defects $cm^{-2}$ in some embodiments, less than about $10^4$ defects $cm^{-2}$ in some embodiments, less than about $10^2$ defects $cm^{-2}$ in some embodiments, and yet less than about 10 defects $cm^{-2}$ in some embodiments.

Reflector layers 215 may be formed (e.g., by epitaxial growth) over the base layer 210. The reflector layers may be formed using any suitable chemical vapor deposition (CVD) process (such as metalorganic chemical vapor deposition) or an atomic layer deposition (ALD) process. The reflector layers may comprise one or more layer pairs of alternating conductivity. In some embodiments, a layer pair may comprise a first layer 222 of heavily doped ($n^{++}$ doping) n-type III-nitride material and a second layer 212 of undoped or unintentionally-doped III-nitride material. A doping density of the heavily doped layers may be between approximately $8\times10^{18}$ $cm^{-3}$ and approximately $5\times10^{19}$ $cm^{-3}$, according to some embodiments. There may be between 1 and 10 reflector layer pairs for the bottom-side reflector. In some implementations, there may be four or five reflector layer pairs.

Thicknesses of the reflector layers 215 may be such that a respective layer corresponds to an odd number of quarter wavelengths (e.g., $\lambda/4$, $3\lambda/4$, $5\lambda/4$, etc.) for a peak emission wavelength $\lambda$ (measured in air) that will be emitted by the finished light-emitting device. In some embodiments, the undoped layers 212 remain in a finished device, so that the refractive index of the layer should be taken into account when determining a thickness for the layers. For example, a layer thickness $3\lambda/4$ may be reduced by the refractive index value $n_{212}$ for determining the thicknesses of the undoped layers 212. Portions of the heavily doped layers 222 may be removed in a finished device (at least adjacent an active area of the light-emitting device), so that the layer thickness may be an odd number of quarter wavelengths as measured in air.

In some implementations, an undoped highly resistive layer 214 (e.g., a layer having a resistivity greater than approximately $10^3$ ohm-cm) may be formed over the reflector layers, e.g., by epitaxial growth. The resistive layer may comprise a III-nitride material. In some implementations, the resistive layer 214 electrically isolates the reflector layers and lower substrate from the device. The resistive layer 214 may also provide a crystal template for subsequent growth of the device layers. In some embodiments, the undoped layer 214 may provide a spacing function. For example, the undoped layer 214 may be used to adjust an optical distance between the two cavity reflectors of a microcavity laser, so that the two reflectors are effectively located at nodes of a standing optical wave within the laser cavity.

Device layers 224, 226, 230, 240, may all be formed over the resistive layer 214. Some device layers may be formed by epitaxial growth (e.g., using any suitable chemical vapor deposition (CVD) process or atomic layer deposition (ALD) process), during which dopants may be added to dope the layers to a selected doping density. According to some embodiments, a lightly doped ($n^-$ doping) n-side conductive layer 224 comprising III-nitride material may be formed adjacent the resistive layer 214. A dopant density for the conductive layer may be between approximately $5\times10^{17}$ $cm^{-3}$ and approximately $2\times10^{18}$ $cm^{-3}$. The conductive layer 224 may have n-type conductivity and be used in a finished device for external electrical connection, for example, through a contact pad, wire 175, or conductive interconnect formed to contact the conductive layer. A thickness of the conductive layer may be between approximately 50 nm and approximately 500 nm, according to some embodiments, though smaller or greater thicknesses may be used in some embodiments.

A highly doped ($n^+$ doping) current-guiding layer 226 comprising III-nitride material may be formed adjacent the conductive layer 224. According to some embodiments, a dopant density for the current-guiding layer may be between approximately $3 \times 10^{18}$ cm$^{-3}$ and approximately $1 \times 10^{19}$ cm$^{-3}$. The conductivity of the current-guiding layer 226 may be n-type. A resistivity of the current-guiding layer may be between approximately $5 \times 10^{-4}$ ohm-cm and approximately 0.01 ohm-cm, in some embodiments. A thickness of the current-guiding layer may be between approximately 50 nm and approximately 500 nm, according to some embodiments, though smaller or greater thicknesses may be used in some embodiments. In some implementations, the current-guiding layer may be between approximately 100 nm and approximately 250 nm thick.

An active layer 230 may then be formed adjacent the current-guiding layer 226. The active layer may be configured to generate photons through carrier recombination. In some embodiments, the active layer may comprise a p-n or p-i-n junction for a light-emitting diode. In some implementations, the active layer 230 comprises multiple thin layers of alternating heterogeneous III-nitride materials that form a multiple quantum well (MQW) structure. For example, an MQW structure may comprise alternating layers of InGaN and GaN, according to some embodiments. In some aspects, an MQW structure may comprise AlInGaN and GaN layers. There may be between two and twenty such layer pairs in an MQW structure. A thickness of the active layer 230 may be between approximately 50 nm and approximately 200 nm, according to some embodiments, though smaller or greater thicknesses may be used in some cases.

In some implementations, a p-side conductive layer 240 is formed adjacent the active layer. The p-side conductive layer may be formed from a III-nitride material (e.g., p-GaN:Mg), and have a doping density between approximately $10^{15}$ cm$^{-3}$ and approximately $10^{19}$ cm$^{-3}$. A thickness of the p-side conductive layer 240 may be between approximately 50 nm and approximately 500 nm, according to some embodiments, though smaller or greater thicknesses may be used in some embodiments.

In some implementations, the resistive layer 214, conductive layer 224, current-guiding layer 226 and p-side conductive layer 240 all comprise device-quality GaN semiconductor material. In other implementations, other materials may be used. In some implementations, combinations of III-nitride materials may be used in a device. For example, some layers may comprise GaN whereas other layers may comprise AlGaN and/or InGaN.

Referring to FIG. 2B and according to some embodiments, a current-blocking insulator 250 may be patterned on the p-side or top-side conductive layer 240. The current-blocking insulator may comprise an oxide or insulating nitride, and may be deposited by a physical deposition process (e.g., e-beam evaporation) or other suitable deposition process (e.g., plasma-enhanced chemical-vapor deposition (PECVD)). A thickness of the insulator may be between approximately 20 nm and approximately 100 nm, though smaller or greater thicknesses may be used in other embodiments. A via 252 may be patterned in the current-blocking insulator 250 using any suitable lithography process (e.g., photolithography). A lithograph process may comprise depositing a resist, patterning the resist to remove a portion where the via 252 is to be formed, etching the via through the insulating layer 250, and removing the remaining resist. The etching may comprise a dry etch (e.g., reactive ion etching (RIE)) or a wet etch. The via 252 may define the location of a vertical cavity for a light-emitting device, and provide a path for vertical current flow.

A transparent conductor 260 may be deposited over the layers as depicted in FIG. 2C. The transparent conductor may comprise indium tin oxide (ITO), according to some embodiments, though other transparent conductors may be used, such as fluorine doped tin oxide (FTO), aluminum doped zinc oxide, and gallium doped zinc oxide. The transparent conductor may be deposited by any suitable physical or chemical deposition process, and may have a thickness between approximately 20 nm and approximately 100 nm, though smaller or greater thicknesses may be used in some embodiments. The transparent conductor may allow current spreading on the p-side, contact area of the device and provide a contact layer for external electrical connection (e.g., through a contact pad, wire 175, or conductive interconnect) to the p-side of the light-emitting device.

According to some embodiments, a resist 270 may be patterned over the transparent conductor, and a sequence of etching steps may be executed to form a mesa structure 205, as depicted in FIG. 2D. The resist may be a hard resist (e.g. a metal or inorganic material) or a soft resist (e.g., a polymeric resist such as photoresist). The etching steps may comprise anisotropic dry etching processes (e.g., RIE) that use etchants selected for removal of the different materials in the layers. For example, GaN or III-nitride layers may be etched using chlorine-based etchants and the oxide layers may be etched using fluorine-based etchants, although other etchants may be used additionally or alternatively for the different materials. In some implementations, inert gases such as argon may be added to the etchants. The etching may proceed at least to the n-side conductive layer 224. In some implementations, etching may continue at least partially into the n-side conductive layer, so that the highly-doped current guiding layer 226 is removed from the surface of the conducting layer 224 around the mesa. In various embodiments, the etching exposes side surfaces of the highly-doped layer 226. The height of the mesa may be between approximately 200 nm and approximately 800 nm, in some embodiments. In other embodiments, a mesa 205 may be shorter or taller.

Lateral electrochemical (EC) etching may then be used to convert at least a portion of the highly-doped layer 226 to a porous semiconductor material 228, as depicted in FIG. 2E. The porous semiconductor material may be nanoporous material having a range of pore sizes less than about one micron. A resistivity of the NP semiconductor material 228 may be between approximately $10^{-3}$ ohm-cm and approximately 0.1 ohm-cm, according to some embodiments. Nanoporous (NP) GaN, for example, has a fibrous microstructure that is mechanically stable. At the same time the porous nature allows deep permeation of gaseous and liquid species, so that reactions may occur deep underneath a surface of the material.

The lateral EC etching may be timed so that the nanoporous region extends partway into the mesa 205, but leaves a central region 227 of the highly-doped semiconductor layer 226 unetched, so that electrical current may flow through the central region. According to some embodiments, the EC etching and porosification extends between approximately 5 microns and approximately 15 microns from and edge of the mesa 205 into a the current-guiding layer. The remaining unetched region may have a lateral dimension or diameter between approximately 1 micron and approximately 50 microns, according to some embodiments. Smaller or larger diameters may be implemented in other embodiments. In some embodiments, the electrochemical etching may use a hydrofluoric-based etchant, though other etchants (e.g., oxalic acid, sulfuric acid, phosphoric acid, hydrochloric acid, potassium hydroxide, sodium hydroxide, nitric acid, or sodium chloride) may be used in other embodiments. In some implementations, the acid or base solutions may be non-aqueous.

The phrase "electrochemical etching" or "EC etching" is used consistently with its recognized meaning in the field of microfabrication to refer to a process in which a material is etched in an etchant bath while applying a bias voltage between the etchant (also referred to as electrolyte) and the material to be etched. Electrochemical etching differs from photoelectrochemical (PEC) etching in that PEC etching requires illumination of the material for etching to occur, whereas EC etching does not require illumination of the material for etching to occur. Accordingly, EC etching is recognized in the field of microfabrication as a different process from PEC etching. An advantage of EC etching is that it is not susceptible to etch-rate variations that can arise from non-uniform illumination of a material. An additional advantage of EC etching is that etching can occur in buried regions or regions that may not be illuminated by external light.

During EC etching of the highly-doped current-guiding layer 226, a bias voltage may be applied between the etchant and the mesa and may have a value between approximately 5 volts and approximately 60 volts, in some embodiments. In some cases, a bias voltage may be between 1 volt and approximately 60 volts. The inventors have found that the applied bias voltage may depend upon the etchant used and the doping density of the layer to be etched. Depending upon the etching parameters (doping density, etchant, temperature, and bias voltage) a III-nitride material may be either (1) not etched or etched slowly, (2) porosified, or (3) completely removed. Therefore careful control of the etching conditions is maintained to porosify a portion of the current-guiding layer 226.

The light-emitting structure may subsequently be exposed to an oxidation process that converts the nanoporous region 228 into a porous oxide region 229, as depicted in FIG. 2E. For example, nanoporous gallium nitride, which conducts electricity, may be converted into a nanoporous gallium oxide, which is an insulating or highly resistive material. The oxidation process may comprise subjecting the structure to a wet environment (e.g., $H_2O$ ambient) or an $O_2$ ambient at elevated temperatures for a duration between approximately 1 hour and approximately 30 hours. The temperature may be between approximately 600° C. and approximately 1000° C. In some embodiments, a photo-electrochemical (PEC) oxidation process may be used. The resulting structure may include an unetched, highly-doped, semiconductor region 227 at a center of the mesa 205, and a region of nanoporous, insulating oxide 229 that may extend partly or all around the highly-doped semiconductor region 227. The nanoporous oxide 229 may prevent current spreading on the n-side or bottom-side of the light-emitting structure, and help confine and guide electrical current through a central part of the device's active region 230. A resistivity of the nanoporous oxide 229 may be greater than approximately $10^3$ ohm-cm in some implementations, and greater than approximately $10^4$ ohm-cm in some embodiments.

According to some embodiments, contact pads or contact features may be formed on p-side and n-side conducting layers of the light-emitting structure, as depicted in FIGS. 2F-2G. In some embodiments, a first contact pad 274 may be formed on a p-side of the device (e.g., at a top of the mesa 205). An insulating layer (e.g., an oxide) may be deposited before forming the top-side contact pad to prevent unwanted shorting of device layers along the edge of the mesa, in some embodiments. In some implementations, an insulated second mesa and connecting bridge (not shown) may be formed adjacent the device mesa 205, so that a p-side contact pad 274 may extend across to the second mesa. An n-side contact pad 272 may be formed on conductive layer 224 to connect with an n-side or bottom-side of the device. The n-side contact pad 272 may be formed near a base of the mesa 205. In some embodiments, a contact pad may extend fully around a peripheral region of the mesa. In some implementations, a contact pad may extend a portion of a way around a peripheral region of the mesa. The contact pads may have any suitable shape and may include larger features (e.g., larger rectangular, polygonal, or elliptical pads) that may be used to connect to other elements of a circuit. In some embodiments, the contact pads 272, 274 may connect to larger conductive bonding pads for wire bonding or solder bonding, for example.

Contact pads to the n-side and p-side layers may be formed by any suitable lithographic process. One method for forming contact pads is to use a lift-off process. This may entail depositing a photoresist over the light-emitting structure, patterning the photoresist using photolithography to open up regions where the contacts will be formed, performing a metal deposition, and then dissolving any remaining photoresist and overlying metal to lift off excess metal and leave the contacts on the n-side and p-side layers of the device. According to some embodiments, contacts may be formed from a metal that may be deposited during a metallization level.

Referring to FIG. 2H, a p-side or top-side reflector 280 may then be formed over the light-emitting structure, according to some embodiments. In some embodiments, a p-side reflector may not be used. A p-side reflector may comprise one or more dielectric layers that are deposited by any suitable physical or vapor deposition process. In some embodiments, the layers of the top-side reflector may be deposited by e-beam evaporation steps. In some cases, the dielectric layers may have alternating values of refractive index and form a dielectric mirror. In some aspects, the p-side reflector may comprise layers of a dielectric material alternating with layers of metal. In other implementations, a p-side reflector may comprise a metallic layer having a thickness that reflects most of the radiation incident from the laser cavity, but transmits a small amount as the output beam 160. In some embodiments, the metallic layer may also provide a p-side electrical contact to the device.

A p-side reflector may be formed using a lift-off process, according to some embodiments. For example, a resist may be patterned over the light-emitting structure, and one or multiple depositions of layers for the reflector 280 may be carried out. Subsequently, the resist may be dissolved to remove reflector material from everywhere except for a top region of the mesa 205.

According to some embodiments, a resist 290 may be deposited over the light-emitting structure and a hole 292 may be patterned in the resist adjacent the mesa 205, as depicted in FIG. 2I. The hole in the resist may expose a surface area of the conducting layer 224. An etching step may then be carried out to form a via 294 into the multilayer structure. In various embodiments, the via 294 may extend through the reflector layers 215, so as to expose edge surfaces of the heavily doped semiconductor layers 222. The etching used to form the via 294 may comprise an anisotropic dry etching process, such as RIE using chlorine-based etching chemistry. The hole 292 and via 294 may have any suitable shape, e.g., circular, elliptical, square, rectangular, or polygonal.

In some embodiments, a via may be formed using a laser drilling process and without the use of a resist 290. For example, a laser beam may be focused on the substrate and the intensity varied in time to optically drill into the semiconductor layers.

After formation of the via 294, a lateral EC etching step may then be carried out to remove portions of the highly doped layers 222, as depicted in FIG. 2J. Complete removal of the heavily doped material can be achieved under correct and controlled etching conditions. For example, a hydrofluoric-based etchant may be used and a bias between approximately 20 volts and approximately 60 volts may be applied. The etching may be timed so that an etching front 295 extends partway or all the way across the mesa 205, as depicted in FIG. 2K. The removal of the heavily doped material 222 forms a semiconductor/air distributed Bragg reflector (DBR) on the bottom-side or n-side of the light-emitting device. This DBR structure can provide a wide-bandwidth, high-reflectance mirror with only about four layer pairs. In some implementations, fewer layer pairs may be used.

The bottom-side DBR and top-side reflector 280 may form a vertical, optical resonant cavity for the light-emitting device. The length of the resonant cavity may be between approximately 150 nm and approximately 5 microns, according to some embodiments. In some embodiments, the resonant cavity comprises an optical microcavity that has a length on the order of up to a few wavelengths of radiation produced in the device's active region. In some implementations, electrical current is confined and flows centrally through the resonant cavity due to the oxide 250 and porous current-guiding region 229.

Although FIGS. 2J-2K depict lateral etching from a single via 294 to form the semiconductor/air DBR on the bottom-side of the light-emitting device, multiple vias may be formed in other embodiments to carry out lateral etching from multiple points and removal of the heavily doped layers 222. FIG. 2L depicts an embodiment where two vias 294 are formed adjacent the mesa 205. Etching fronts 295 may extend from each via 294 toward a center of the mesa 205 to remove the heavily doped material 222 below the mesa. For this embodiment, there may be regions 297 adjacent the mesa where the heavily doped material is not removed. These regions may provide structural support near a base of the mesa, and they may be distributed evenly around the mesa. For example, the regions 297 may extend under an edge of the mesa in some embodiments, or may extend to within 50 microns or less from the edge of the mesa in some implementations. The regions 297 may help mechanically stabilize the bottom-side DBR structure and maintain a longitudinal cavity length of the light-emitting device. In other embodiments, three or more vias 294 may be formed adjacent the mesa 205, which may create additions regions 297 around the base of the mesa.

FIG. 2M depicts, in elevation view, an embodiment of a vertical-cavity surface-emitting laser that may be manufactured according to the foregoing processes. Wire bonds 170, 175 or other external electrical connections may be connected to the contacts 274, 272, and used to apply an electrical bias between the p- and n-side of the light-emitting device. According to some embodiments, the current-guiding oxide 250 at the p-side of the device confines electrical current to a central active region of the device. Additionally, the porous current-guiding oxide 229 at the n-side of the device helps confine current within the central active region, and prevents current spreading on the n-side of the device. As a result, electrical current passes primarily through a central area of the device's active layer 230, so that photons are generated in a region that spatially overlaps well with one or more cavity modes of the light-emitting device. Improved overlap between the photon generation region and the cavity modes can improve the efficiency of the light-emitting device.

Although the foregoing description of a light-emitting device includes an n-region of the device on the bottom-side and a p-region of the device on the top-side, other implementations may have the n-region and p-region inverted compared to what is shown in the drawings. In such embodiments, a bottom-side reflector may be associated with a p-side of the device, and a top-side reflector 280 may be associated with an n-side of the device.

An alternative embodiment of a light-emitting device is depicted in FIG. 2N. For this embodiment, a trench 297 may be etched into the multilayer structure to define the device's mesa 205, leaving device layers surrounding the mesa. This process removes less total material of the device layers while still forming a mesa. According to some embodiments, an isolation trench 254 may be formed around the mesa to electrically isolate the light-emitting device from other regions of the substrate. The isolation trench 254 may subsequently be filled with a field oxide 255, and an n-side contact may be formed to extend over the field oxide 255, as depicted in the drawing.

As described above, two lateral EC etching steps are used to form a bottom-side, porous, current-guiding region 229 and a bottom-side air/semiconductor DBR. In some implementations, these steps are carried out separately. In some embodiments, the steps may be carried out at a same time. For example, the doping density of the heavily doped layers 222 and current-guiding layer 226 may be selected such that complete removal of the heavily doped layers and porosification of the current-guiding layer occurs in a same etchant under a same bias. Additionally, dopant densities in the two layers and device dimensions may be tailored such that the desired etching distances are achieved for lateral porosification and material removal during a same etching time. For example, a dopant density in the heavily-doped layer may be selected to give a higher etching rate than the etching rate in the current guiding layer 226. Some examples of etchants, doping density ranges, bias voltages, and etching characteristics for GaN are listed in Table 1.

TABLE 1

| etchant | doping range (cm$^{-3}$) | bias range (V) | characteristic |
|---|---|---|---|
| 0.03-0.3M oxalic acid | $1 \times 10^{18}$-$1 \times 10^{19}$ | 5-25 | porosification |
| 0.03-0.3M oxalic acid | $1 \times 10^{18}$-$5 \times 10^{19}$ | 15-60 | removal |
| 25%-50% HF acid | $1 \times 10^{18}$-$1 \times 10^{19}$ | 7-55 | porosification |
| 25%-50% HF acid | $8 \times 10^{18}$-$5 \times 10^{19}$ | 20-60 | removal |

Examples

Example process steps were carried out for fabricating a vertical light-emitting device. In one process, a layer of n-doped GaN (approximately 5 microns thick) was laterally EC etched from the edge of a mesa to create a porous region between two III-nitride layers. The electrochemical etchant was 1:1 HF:$H_2O$, and EC etching was carried out at room temperature and bias voltages ranging between 7 V and 20 V. The rate of lateral porosification varied from about 1 micron/minute to about 10 microns/min, depending on the bias voltage used.

Figure 3A:
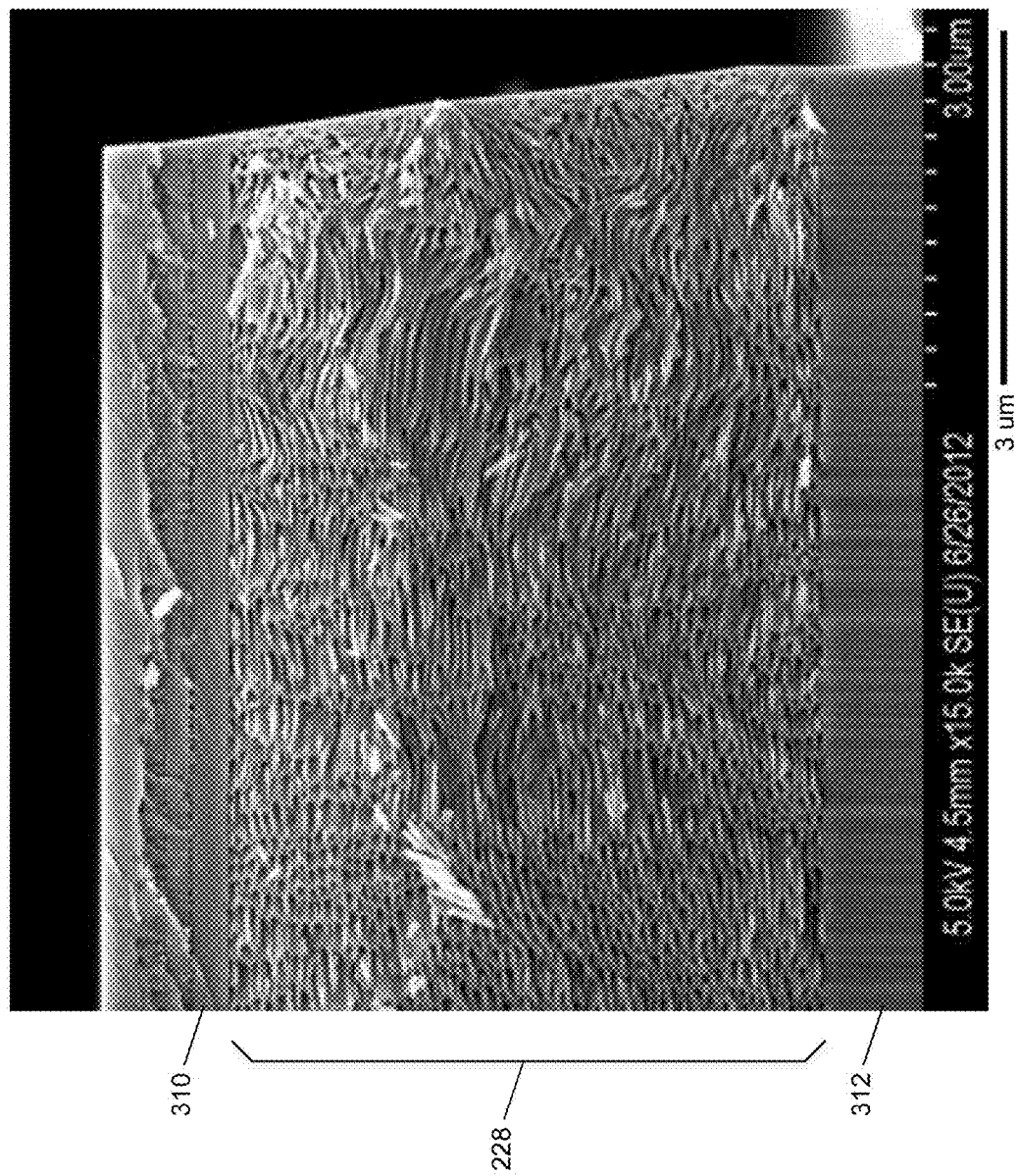
FIGS. 3A-3B are scanning-electron micrographs showing lateral porosification of a GaN semiconductor layer.

A result of the etching is shown in FIG. 3A, which represents a cross-sectional scanning-electron micrograph of a mesa structure having an n-type GaN layer 228. The layer has been laterally etched to form a porous semiconductor region between two III-nitride semiconductor layers 310, 312 that bound the bottom and top of the porous region. Because of their different doping densities, the adjacent III-nitride layers have not been porosified. The porous region comprises single-crystalline nanoporous (NP) GaN. The rate of advancing the porosification of the current-guiding layer 228 from the edge of a mesa can be controlled without impacting the adjacent device layers.

Figure 3B:
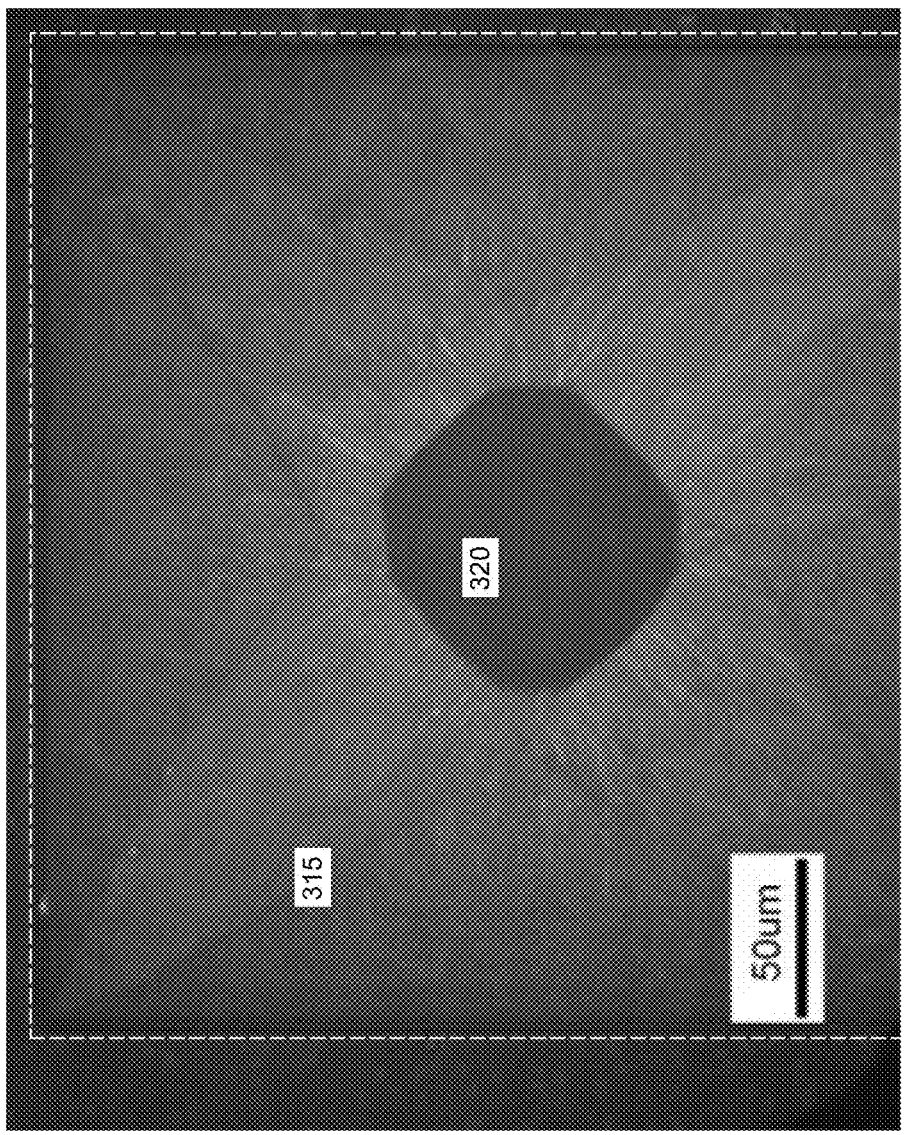

FIG. 3B shows a plan-view, microscope image of a laterally-porosified semiconductor region 315 that lies between the two unetched layers of FIG. 3A. A square-shaped mesa structure measuring about 300 microns on a side (outlined by the dashed line) was subjected to a timed lateral EC etching process. The etch was stopped to leave a highly-doped semiconductor region 320 (dark polygon) at the center of the mesa. The highly-doped region may provide a vertical current path for a light-emitting device. Lateral porosification extends for up to or more than 100 microns into the mesa.

Figure 3C:
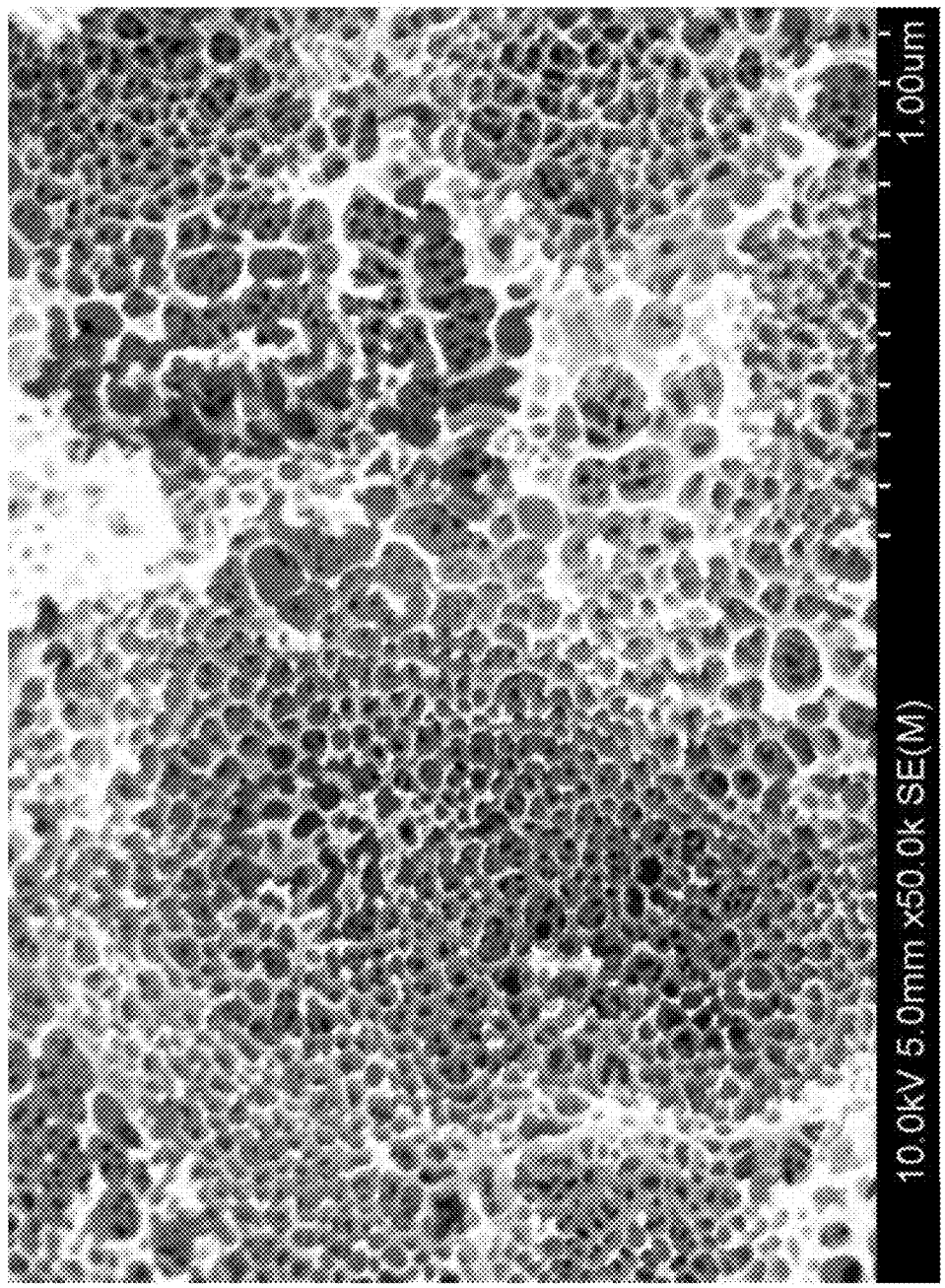
FIG. 3C is a scanning-electron micrograph showing porous GaN.
Figure 3D:
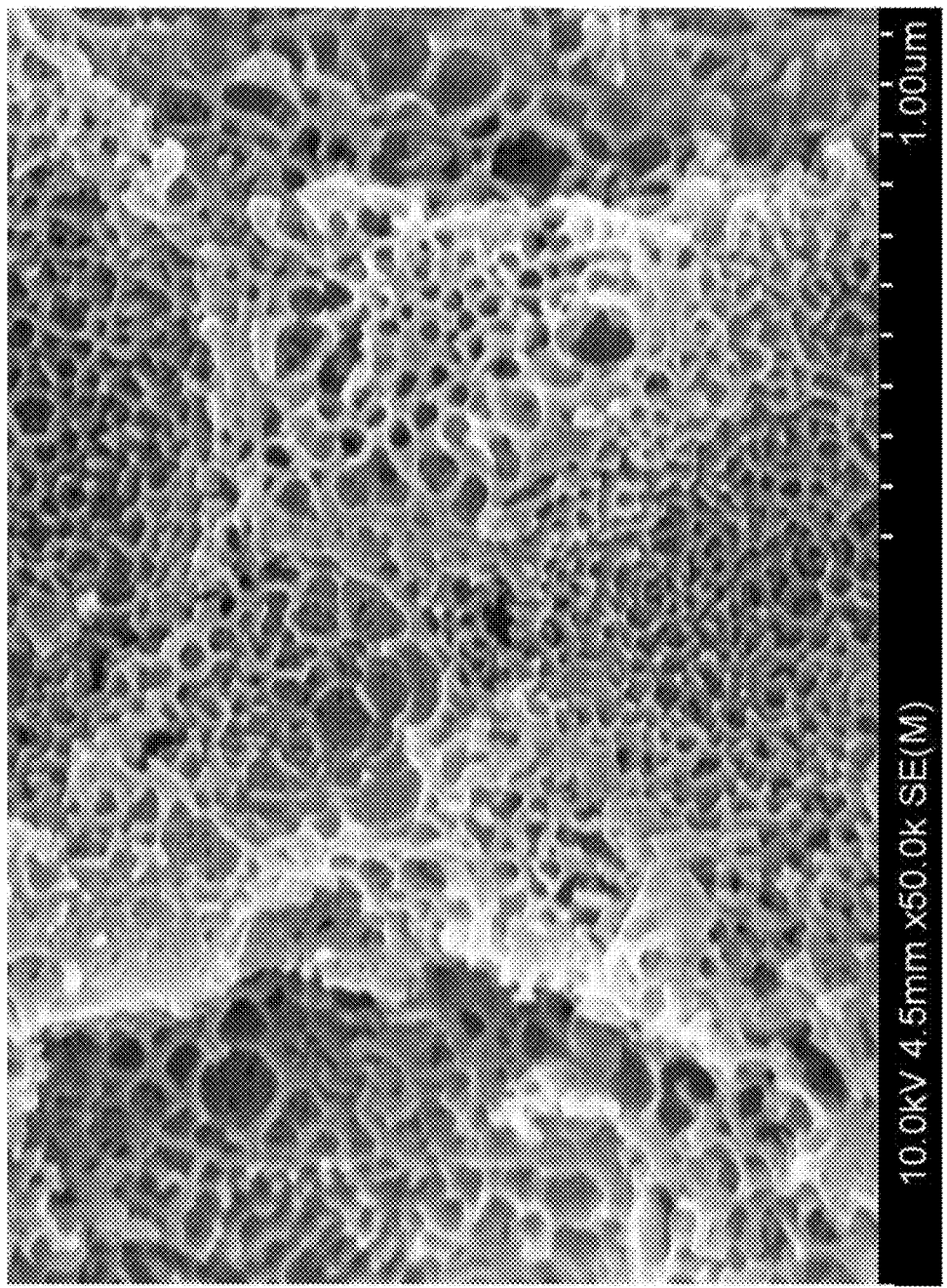
FIG. 3D is a scanning-electron micrograph showing porous GaO$_x$ that has been formed from porous GaN.

Oxidation of NP GaN was carried out, and the resulting oxidized structure was compared the microstructure before oxidation. A portion of the nanoporous structure before oxidation is shown in FIG. 3C. As may be seen in FIG. 3C, pore sizes of a laterally porosified region 315 range between about 200 nm down to about 20 nm. The oxidation took place at about 900° C. in air for 4 hours. The microstructure after oxidation (portion shown in FIG. 3D) remained largely unchanged, but the fibrous nanostructure was converted from conductive GaN to $GaO_x$ an insulator.

Figure 4:
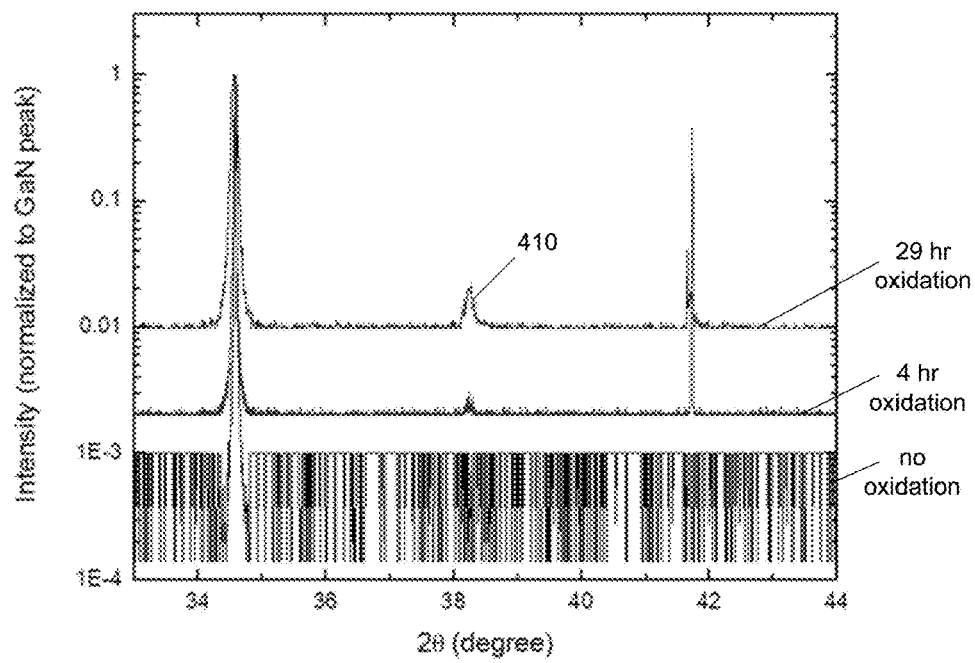
FIG. 4 illustrates x-ray diffraction measurements associated with oxidation of porous GaN.

FIG. 4 shows the x-ray diffraction curves (2θ-ω scans) from a porosified GaN sample before, during, and after oxidation. The as-porosified GaN sample (lower trace) shows a strong (002) peak from GaN at about 34.6°. After 4 hours of oxidation, the sample shows the emergence of a (311) peak due to the formation of monoclinic $GaO_x$ at around 38.2°. From a Hall measurement, the as-porosified NP GaN exhibited a carrier concentration of $7 \times 10^{17}$ $cm^{-3}$ and a mobility of approximately 30 $cm^2$/V-sec. After oxidation, the fibrous structure becomes highly resistive. The resistivity of the porous oxide is measured to be greater than $10^4$ ohm-cm, which is an increase by at least six orders of magnitude compared to the unetched GaN layer. A porous, oxidized, current-guiding region 229 can then prevent current spreading on the bottom-side of a light-emitting device, and improve VCSEL performance.

Figure 5:
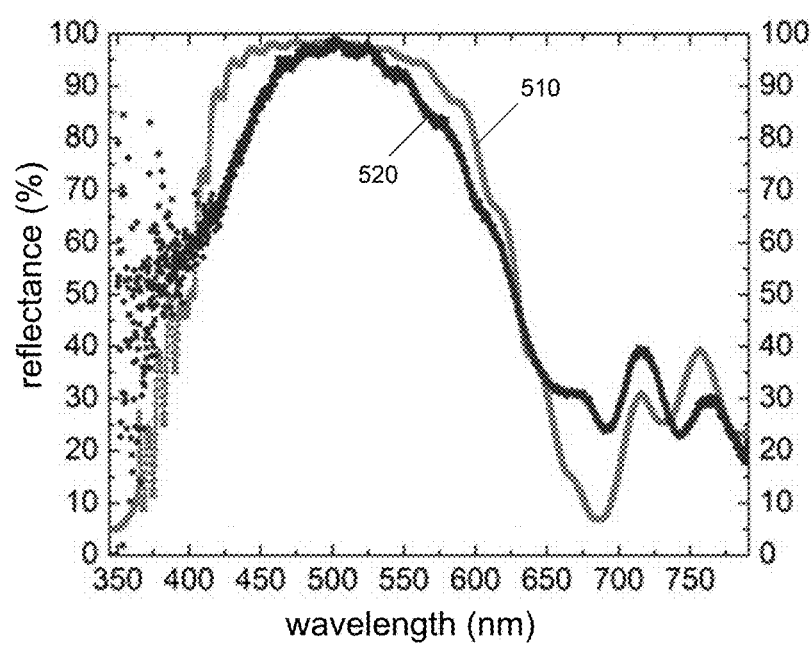
FIG. 5 illustrates simulated (curve 510) and measured (curve 520) reflectance of an air/GaN distributed Bragg reflector.

An n-side or bottom side DBR was formed from four layer pairs of alternating heavily-doped and undoped GaN layers. The heavily doped layers were completely removed by lateral EC etching to produce four air/GaN layer pairs for the DBR structure. The formation of air-gaps was confirmed by scanning electron microscopy. Micro-reflectance measurements (curve 520) were made and the results are plotted against simulated results 510 for the DBR structure, as shown in FIG. 5. The results show that over 98% peak reflectance with a stopband of over 150 nm can be achieved with just four pairs of GaN/air layers.

CONCLUSION

Methods and structures described above for fabricating III-nitride vertical light-emitting devices may have certain advantages over conventional methods for fabricating VCSELs, for example. In some implementations, the fabrication of GaN/air-gap DBRs (with only a few layer pairs needed) may be an easier manufacturing process than the epitaxial growth of tens of layer pairs for AlGaN/GaN DBRs. The techniques for forming bottom-side reflectors can avoid wafer or laser lift-off (LLO) processes and may be compatible with conventional and mature LED processing. In some embodiments, the use of GaN/air-gap DBRs enables true microcavity fabrication with a cavity length on the order of the lasing wavelength, which may not be possible with epitaxial of DBR structures having tens of semiconductor/semiconductor layers or with laser lift-off structures. Further, the use of porosification and oxidation processes can enable the creation of a current-guiding layer on the n-side of a vertical light-emitting device, which can improve device efficiency and performance. It should also be noted that the methods and structures exhibit substrate-independence. For example, the methods may be implemented with sapphire, GaN, Si, or SiC substrates, whereas conventional lift-off techniques for GaN devices may only be possible with sapphire substrates. According to some embodiments, the use of conductivity-based electrochemical (EC) etching may be easier during manufacture than photo-electrochemical (PEC) etching processes that can require difficult growth and etching steps needing uniform illumination.

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

Selective etching, as used herein, comprises subjecting a substrate to an etchant that preferentially etches at least one material at a faster rate than a second material. In some cases, the second material may be formed as a hard mask (e.g., an inorganic material such as an oxide, nitride, metal, or the like) or soft mask (e.g., a photoresist or polymer). In some embodiments, the second material may be part of a device structure that has different material characteristics than the first material (e.g., doping density, material composition, or crystal structure). The etch may be a dry etch or wet etch.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Although the drawings typically depict one light-emitting device, it will be appreciated that a large number of such devices can be fabricated in parallel on a substrate. A light-emitting device fabricated according to the present teachings may be formed in an integrated circuit in large numbers and at high densities. In some embodiments, the light-emitting devices may be used in consumer electronic devices such as smart phones, tablets, PDA's, computers, televisions, sensors, lighting, projectors, displays, as well as application-specific integrated circuits.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A semiconductor light-emitting device comprising:
a substrate;
an active region comprising semiconductor material, wherein the active region has a first area and at least a portion of the active region is configured for carrier recombination;
a doped semiconductor region comprising a first portion of a layer having a thickness and located between the active region and the substrate, the doped semiconductor region having a second area smaller than the first area; and
a porous oxide region formed from a second portion of the layer and extending around the doped semiconductor region and located between the active region and the substrate, wherein the porous oxide comprises pores extending laterally into the second portion of the layer, and wherein the porous oxide is porous gallium oxide.

2. The semiconductor light-emitting device of claim 1, wherein the active region and doped semiconductor region comprise III-nitride material.

3. The semiconductor light-emitting device of claim 2, wherein the active region is configured to produce photons when electrical current flows through the active region.

4. The semiconductor light-emitting device of claim 1, wherein the porous oxide region is formed in and from a same layer of material as the doped semiconductor region.

5. The semiconductor light-emitting device of claim 1, wherein the doped semiconductor region comprises n-type conductivity material.

6. The semiconductor light-emitting device of claim 1, wherein the active region comprises multiple quantum wells formed from layers of III-nitride material.

7. The semiconductor light-emitting device of claim 1, further comprising a conductive layer of semiconductor material formed between the doped semiconductor region and the substrate, wherein a doping density of the conductive layer is less than a doping density of the doped semiconductor region.

8. The semiconductor light-emitting device of claim 7, further comprising an undoped semiconductor layer between the conductive layer of semiconductor material and the substrate.

9. The semiconductor light-emitting device of claim 7, wherein a doping density of the conductive layer is between approximately $5 \times 10^{17}$ cm$^{-3}$ and approximately $2 \times 10^{18}$ cm$^{-3}$ and a doping density of the doped semiconductor region is between approximately $3 \times 10^{18}$ cm$^{-3}$ and approximately $1 \times 10^{19}$ cm$^{-3}$.

10. The semiconductor light-emitting device of claim 1, further comprising a first distributed Bragg reflector located between the doped semiconductor region and the substrate.

11. The semiconductor light-emitting device of claim 10, wherein the first distributed Bragg reflector comprises alternating layers of air and III-nitride material.

12. The semiconductor light-emitting device of claim 10, further comprising at least one undoped semiconductor layer between the doped semiconductor region and the first distributed Bragg reflector.

13. The semiconductor light-emitting device of claim 10, further comprising:
a conductive layer having a doping density between approximately $5 \times 10^{17}$ cm$^{-3}$ and approximately $2 \times 10^{18}$ cm$^{-3}$ located between the doped semiconductor region and the first distributed Bragg reflector; and
an undoped semiconductor layer between the conductive layer and the first distributed Bragg reflector, wherein a doping density of the doped semiconductor region is between approximately $3 \times 10^{18}$ cm$^{-3}$ and approximately $1 \times 10^{19}$ cm$^{-3}$.

14. The semiconductor light-emitting device of claim 10, further comprising a second distributed Bragg reflector located on a side of the active region away from the substrate.

15. The semiconductor light-emitting device of claim 14, wherein the second distributed Bragg reflector comprises layers of dielectric material.

16. The semiconductor light-emitting device of claim 1, wherein the porous oxide region has pore sizes less than approximately one micron.

17. The semiconductor light-emitting device of claim 1, wherein the porous oxide region has a range of pore sizes between approximately 20 nm and approximately 200 nm.

18. A method for making an integrated light-emitting device, the method comprising:
forming a mesa on a substrate that comprises an active region comprising semiconductor material, wherein the active region has a first area and at least a portion of the active region is configured for carrier recombination, and a doped semiconductor region comprising a first portion of a layer having a thickness and located between the active region and the substrate, the doped semiconductor region having a second area smaller than the first area;
forming a porous oxide region from a second portion of the layer extending around the doped semiconductor region and located between the active region and the substrate, wherein the porous oxide comprises pores extending laterally into the second portion of the layer, and wherein the porous oxide is porous gallium oxide,
wherein forming the porous oxide region comprises:
etching the layer to form a porous region; and
converting the porous region to porous oxide.

19. The method of claim 18, wherein forming the doped semiconductor region comprises epitaxially growing an n-type conductivity layer of III-nitride material.

20. The method of claim 18, further comprising forming a conductive layer of semiconductor material adjacent the doped semiconductor region, wherein a doping density of the conductive layer is less than a doping density of the doped semiconductor region.

21. The method of claim 20, further comprising:
forming the doped semiconductor region and conductive layer from III-nitride material;
doping the conductive layer with a doping density between approximately $5 \times 10^{17}$ cm$^{-3}$ and approximately $2 \times 10^{18}$ cm$^{-3}$; and
doping the doped semiconductor region with a doping density between approximately $3 \times 10^{18}$ cm$^{-3}$ and approximately $1 \times 10^{19}$ cm$^{-3}$.

22. The method of claim 18, wherein the etching comprises electrochemical etching with a hydrofluoric-based etchant.

23. The method of claim 22, wherein the etching further comprises applying a bias between approximately 7 volts and approximately 20 volts between the doped semiconductor region and an electrode in the etchant.

24. The method of claim 18, wherein the active region is configured to produce photons when electrical current flows through the active region.

25. The method of claim 24, wherein forming the active region comprises forming multiple quantum wells from layers of III-nitride material.

26. The method of claim 18, further comprising forming a first distributed Bragg reflector located between the doped semiconductor region and the substrate.

27. The method of claim 26, wherein forming the first distributed Bragg reflector comprises:
    epitaxially growing at least one layer of n-type III-nitride semiconductor material and at least one layer of undoped III-nitride semiconductor material;
    etching a hole adjacent the mesa to expose sidewalls of n-type III-nitride semiconductor material; and
    electrochemically etching at least a portion of the at least one layer of n-type III-nitride semiconductor material to form at least one air gap between the doped semiconductor region and the substrate.

28. The method of claim 27, wherein the at least one layer of n-type III-nitride semiconductor material comprises GaN and have a doping density between approximately $8 \times 10^{18}$ cm$^{-3}$ and approximately $5 \times 10^{19}$ cm$^{-3}$.

29. The method of claim 28, wherein etching the layer and electrochemically etching at least a portion of the at least one layer of n-type III-nitride semiconductor material are performed in a same etching step.

30. The method of claim 26, further comprising forming at least one undoped semiconductor layer between the doped semiconductor region and the first distributed Bragg reflector.

* * * * *